(12) United States Patent
Takeuchi

(10) Patent No.: US 8,435,093 B2
(45) Date of Patent: May 7, 2013

(54) METHOD OF MANUFACTURING ORGANIC EL DISPLAY PANEL

(75) Inventor: Takayuki Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/356,111

(22) Filed: Jan. 23, 2012

(65) Prior Publication Data
US 2012/0309252 A1    Dec. 6, 2012

Related U.S. Application Data

(63) Continuation of application No. PCT/JP2011/003136, filed on Jun. 3, 2011.

(51) Int. Cl.
  *H01L 51/50* (2006.01)
  *H01L 27/32* (2006.01)
  *H05B 33/10* (2006.01)
  *G09F 9/30* (2006.01)

(52) U.S. Cl.
  USPC .............. 445/24; 438/23; 438/28; 438/29; 438/34; 257/88

(58) Field of Classification Search ................. None
  See application file for complete search history.

(56) References Cited

U.S. PATENT DOCUMENTS

| | | | |
|---|---|---|---|
| 6,329,108 B1 | 12/2001 | Fujiike et al. | |
| 2004/0201818 A1 | 10/2004 | Yamamoto et al. | |
| 2006/0244886 A1* | 11/2006 | Hirai et al. ............ | 349/139 |
| 2008/0286454 A1 | 11/2008 | Yamamoto et al. | |
| 2009/0279012 A1* | 11/2009 | Kuwabara et al. ........ | 349/46 |
| 2009/0284141 A1 | 11/2009 | Sakanoue et al. | |
| 2010/0102310 A1 | 4/2010 | Komatsu et al. | |
| 2011/0193107 A1 | 8/2011 | Takeuchi et al. | |
| 2011/0272677 A1 | 11/2011 | Takeuchi | |
| 2011/0291087 A1 | 12/2011 | Harada et al. | |
| 2011/0291128 A1 | 12/2011 | Harada et al. | |
| 2012/0040478 A1 | 2/2012 | Takeuchi | |
| 2012/0049211 A1 | 3/2012 | Komatsu et al. | |

FOREIGN PATENT DOCUMENTS

| | | |
|---|---|---|
| JP | 5-163488 | 6/1993 |
| JP | 11-101910 | 4/1999 |
| JP | 2001-219558 | 8/2001 |
| JP | 2002-347224 | 12/2002 |
| JP | 2003-172814 | 6/2003 |
| JP | 2006-204964 | 8/2006 |
| JP | 2007-248821 | 9/2007 |
| JP | 2008-111902 | 5/2008 |
| JP | 2009-117140 | 5/2009 |
| JP | 2009-226312 | 10/2009 |
| JP | 2010-204186 | 9/2010 |
| JP | 2010-204189 | 9/2010 |
| JP | 2011-44340 | 3/2011 |

* cited by examiner

*Primary Examiner* — Ashok Patel
(74) *Attorney, Agent, or Firm* — Greenblum & Bernstein, P.L.C.

(57) ABSTRACT

The volume per drop of the drops ejected by each nozzle is detected. It is then determined whether a volume of drops equal to or greater than a target value can be ejected by causing one or more first nozzles to eject drops, the detected volume per drop of the first nozzles falling within a first range of a preset value. When the determination is affirmative, the first nozzles are selected for ejection of drops. When the determination is negative, the first nozzles and one or more second nozzles are selected for ejection of drops. The detected volume per drop of the second nozzles falls within a second range of the present value, where the second range is greater than the first range.

6 Claims, 21 Drawing Sheets

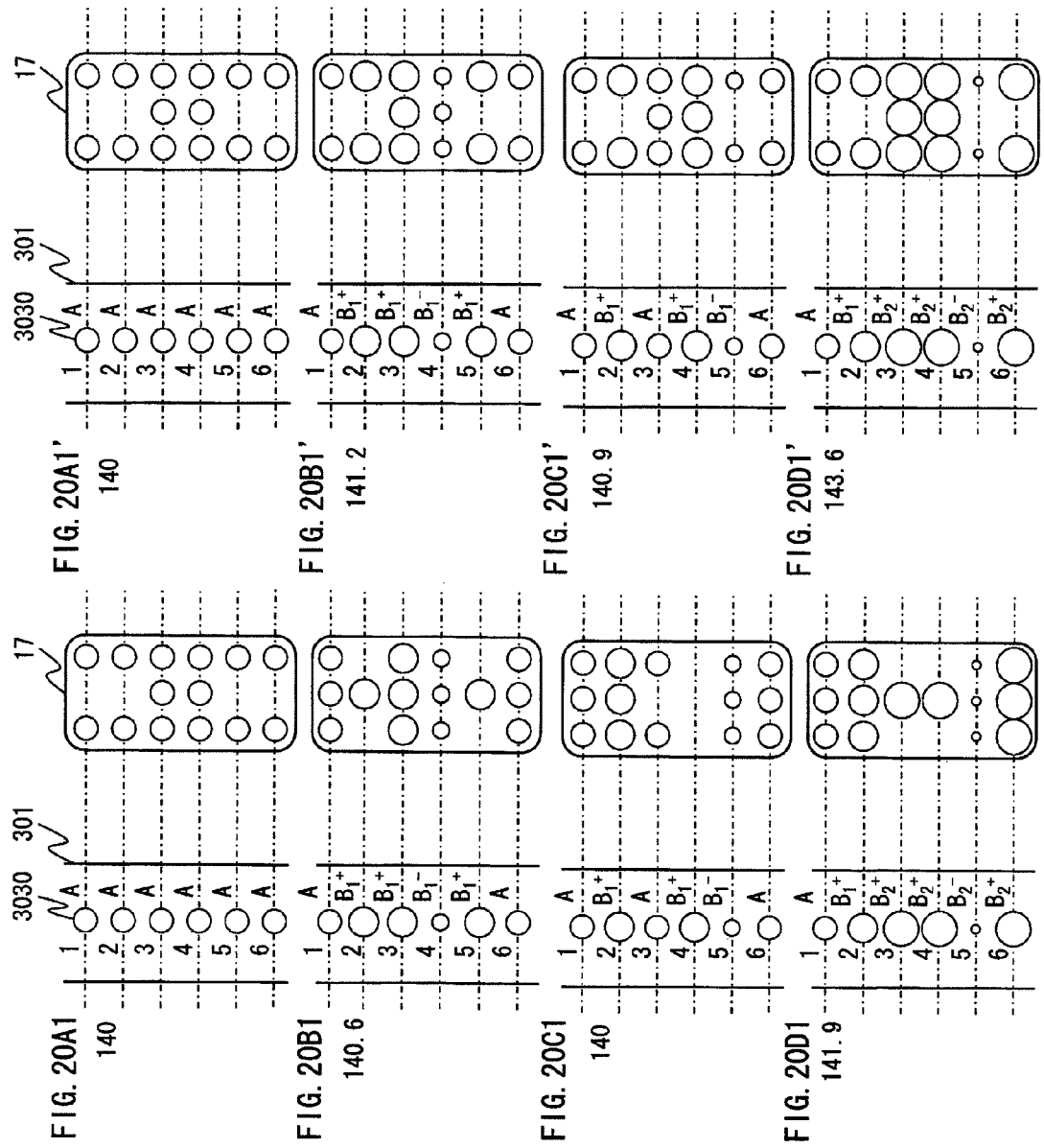

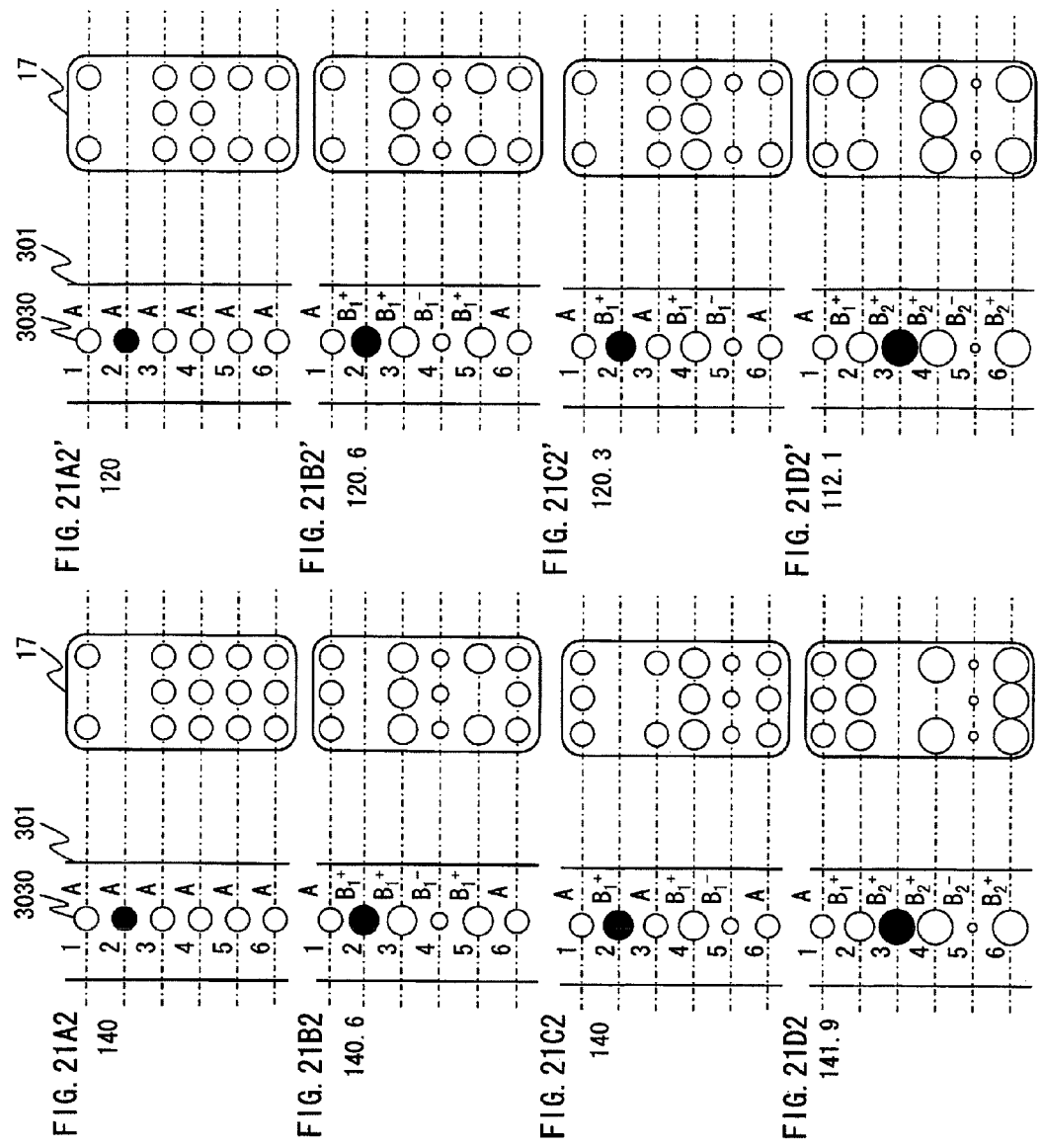

METHOD OF MANUFACTURING ORGANIC EL DISPLAY PANEL

This is a continuation of International Application PCT/JP2011/003136, with an international filing date of Jun. 3, 2011.

TECHNICAL FIELD

The present invention relates to a method of manufacturing organic EL display panels provided with organic EL elements.

BACKGROUND ART

In recent years, organic EL display panels having organic EL elements disposed on a substrate have become more commonly used as display devices. Since organic EL display panels use organic EL elements that emit light, the display panel is highly visible. Furthermore, each organic EL element is a complete solid state device and thus has excellent impact resistance.

Organic EL elements are current-driven light-emitting elements formed by laminating layers between an anode and a cathode electrode pair, such as an organic light-emitting layer that relies on the phenomenon of electroluminescence due to recombination of carriers. In an organic EL display panel, organic EL elements corresponding to the colors red (R), green (G), and blue (B) are formed as sub-pixels. One set of an R, a G, and a B sub-pixel constitutes a single pixel.

Among such organic EL display panels, a wet process (application process) for forming the organic light-emitting layer in each organic EL elements, such as an inkjet method, is well known (see, for example, Patent Literature 1). In the inkjet method, an inkjet head scans over apertures provided in a matrix in the layer of banks of the substrate (the apertures corresponding to regions for forming the organic light-emitting layers). A plurality of nozzles provided in the inkjet head eject drops of ink into each aperture. The ink includes organic material and solvent for forming the organic light-emitting layer. Normally, a drop is ejected multiple times into one aperture. In a piezo inkjet apparatus, the volume of the drops ejected from each nozzle is adjusted by changing the waveform of the driving voltage applied to the piezo element provided in each nozzle.

In an organic EL display panel, it is necessary for the luminance to be even between pixels. Since the luminance depends on the thickness of the organic light-emitting layer, it is necessary for the total volume of the drops ejected into each aperture to be even when the organic light-emitting layer is formed by the above method. Even if a drive signal of the same waveform is applied to each piezo element, however, variation occurs in the volume of the drops ejected from each nozzle, since the ejection characteristics of each nozzle differ. As a result, the total volume of the drops ejected differs for each aperture, causing variation between pixels in the luminance.

To address this problem, Patent Literature 1 discloses technology for detecting beforehand the volume of the drops ejected from each nozzle. Based on the result of detection of each nozzle, the waveform of the driving voltage applied to each piezo element is changed. This technology makes the volume of the drops ejected from each nozzle uniform, thereby making the total volume of the drops ejected into each of the apertures uniform.

CITATION LIST

Patent Literature

Patent Literature 1: Japanese Patent Application Publication No. 2009-117140
Patent Literature 2: Japanese Patent Application Publication No. 2001-219558

SUMMARY OF INVENTION

Technical Problem

With the technology disclosed in Patent Literature 1, it becomes necessary to generate a desired waveform for the driving voltage for each nozzle. Trying to do so for all of the nozzles provided in the inkjet head, however, causes the problem of forcing the inkjet apparatus to perform extremely complicated control. Furthermore, as the size of organic EL display panels increases, the number of nozzles provided in the inkjet head is also expected to increase. Application of the technology disclosed in Patent Literature 1 is thus unrealistic.

The present invention has been conceived in light of the above problems, and it is an object thereof to provide a method of manufacturing an organic EL display panel that employs simple control to make the total volume of the drops ejected into each aperture uniform.

Solution to Problem

An aspect of the present invention is a method of manufacturing an organic EL display panel, comprising: a first step of preparing an EL substrate provided with a layer of banks defining a plurality of apertures arranged in a matrix in one-to-one correspondence with pixels; a second step of detecting a volume per drop of drops ejected by each nozzle of an inkjet head having arranged thereon a row of a plurality of nozzles that eject drops of ink including organic material and solvent; a third step of allocating a predetermined number of nozzles to each aperture by dividing the plurality of nozzles into nozzle groups and assigning one of the nozzle groups to each aperture, and of determining an ejection number of drops to be ejected by each nozzle in each nozzle group in accordance with variation in the detected volume per drop for each nozzle as detected in the second step, so that a total volume of the drops to be ejected into each aperture falls within a reference range; and a fourth step of causing the inkjet head to scan over the EL substrate while causing nozzles in the nozzle groups to eject, into the aperture corresponding to each nozzle group, a number of drops equal to the ejection number determined for each nozzle in the third step.

Advantageous Effects of Invention

With the method of manufacturing an organic EL display panel according to an aspect of the present invention, a predetermined number of nozzles are allocated to each aperture by dividing the plurality of nozzles into nozzle groups and assigning one of the nozzle groups to each aperture. Furthermore, an ejection number of drops to be ejected by each nozzle in each nozzle group is determined. The ejection number is determined for each nozzle in accordance with variation in the volume per drop for the nozzle as detected in the second step, so that the total volume of the drops to be ejected into each aperture falls within the reference range. In other words, in this aspect of the present invention, the number of ejected drops is changed for each nozzle. It is therefore unnecessary to perform complicated control that generates a different waveform for the driving voltage for each nozzle, as in Patent Literature 1.

Accordingly, the method of manufacturing an organic EL display panel according to this aspect of the present invention allows for ejection of a uniform voltage of drops into each aperture while using simple control.

BRIEF DESCRIPTION OF DRAWINGS

FIGS. 20A1-20D1' show the positional relationship between the substrate subject to application and the head section during step S108 in FIG. 8.

FIGS. 21A2-21D2' show the positional relationship between the substrate subject to application and the head section during step S108 in FIG. 8 when a non-ejecting nozzle develops.

DESCRIPTION OF EMBODIMENTS

Summary of Aspects of the Invention

Figure 1:
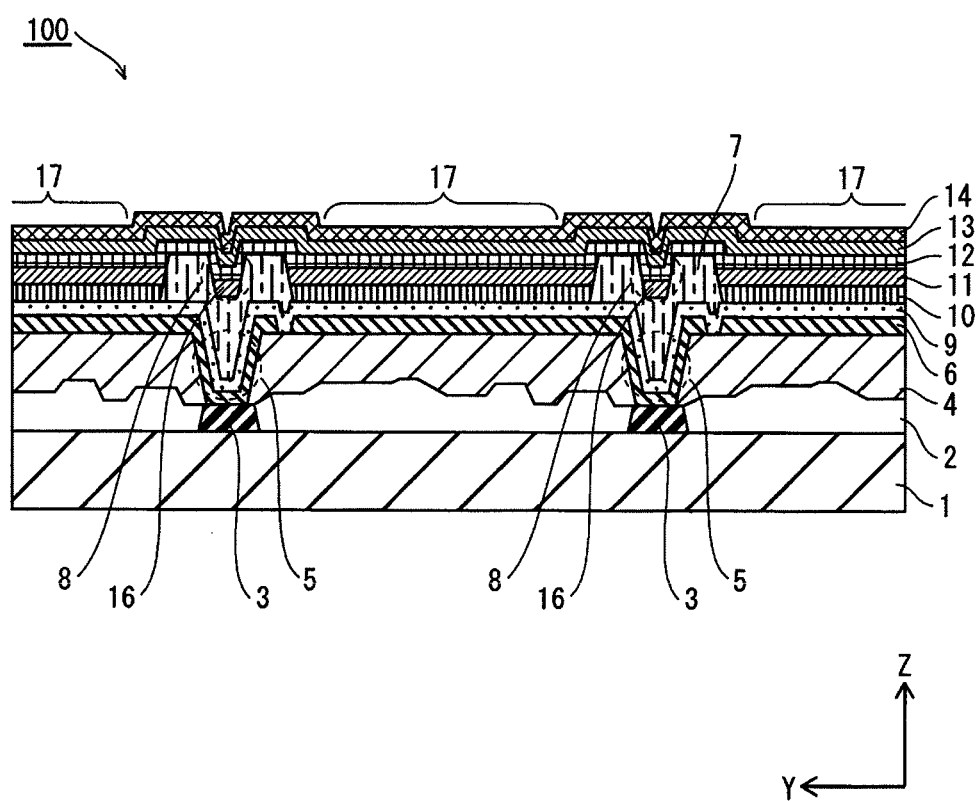
FIG. 1 is a partial cross-section diagram showing the structure of an organic EL display panel according to Embodiment 1.

An aspect of the present invention is a method of manufacturing an organic EL display panel, comprising: a first step of preparing an EL substrate provided with a layer of banks defining a plurality of apertures arranged in a matrix in one-to-one correspondence with pixels; a second step of detecting a volume per drop of drops ejected by each nozzle of an inkjet head having arranged thereon a row of a plurality of nozzles that eject drops of ink including organic material and solvent; a third step of allocating a predetermined number of nozzles to each aperture by dividing the plurality of nozzles into nozzle groups and assigning one of the nozzle groups to each aperture, and of determining an ejection number of drops to be ejected by each nozzle in each nozzle group in accordance with variation in the detected volume per drop for each nozzle as detected in the second step, so that a total volume of the drops to be ejected into each aperture falls within a reference range; and a fourth step of causing the inkjet head to scan over the EL substrate while causing nozzles in the nozzle groups to eject, into the aperture corresponding to each nozzle group, a number of drops equal to the ejection number determined for each nozzle in the third step.

In the method of manufacturing an organic EL display panel according to an aspect of the present invention, each pixel may be a subpixel corresponding to a predetermined luminescent color, and a target value of the total volume of the drops to be ejected into each aperture may be set for each luminescent color. In each aperture into which drops of ink including the organic material of a same luminescent color are ejected, the target value may be within ±2% of the reference range.

In the method of manufacturing an organic EL display panel according to an aspect of the present invention, each subpixel may correspond to a predetermined luminescent color, and a target value of the total volume of the drops to be ejected into each aperture may be set for each luminescent color. The third step may include determining whether a volume of drops equal to or greater than the target value can be ejected by causing one or more first nozzles among the plurality of nozzles to eject drops, the detected volume per drop of the one or more first nozzles falling within a first range of a preset value, selecting the one or more first nozzles for ejection of drops in the fourth step upon determining that a volume of drops equal to or greater than the target value can be ejected by the one or more first nozzles, and selecting the one or more first nozzles and one or more second nozzles for ejection of drops in the fourth step upon determining that a volume of drops equal to or greater than the target value cannot be ejected by the one or more first nozzles, the detected volume per drop of the second nozzles falling within a second range of the preset value, the second range being greater than the first range.

In the method of manufacturing an organic EL display panel according to an aspect of the present invention, the third step may further include, upon determining that a volume of drops equal to or greater than the target value cannot be ejected by the one or more first nozzles, determining whether the second nozzles include one or more nozzle pairs each composed of a nozzle having a detected volume per drop greater than the preset value and a nozzle having a detected volume per drop less than the preset value, and selecting the one or more nozzle pairs for ejection of drops in the fourth step upon determining that the second nozzles include the one or more nozzle pairs.

In the method of manufacturing an organic EL display panel according to an aspect of the present invention, the third step may further include, upon determining that a volume of drops equal to or greater than the target value cannot be ejected by the one or more first nozzles, determining whether the second nozzles include one or more nozzle pairs each composed of a nozzle having a detected volume per drop greater than the preset value and a nozzle having a detected volume per drop less than the preset value, and upon determining that the second nozzles include the one or more nozzle pairs, determining whether the one or more nozzle pairs include one or more first range nozzle pairs, each first range nozzle pair having an average detected volume per drop that falls within the first range, and selecting the one or more first range nozzle pairs for ejection of drops in the fourth step upon determining that the one or more nozzle pairs include the one or more first range nozzle pairs.

In the method of manufacturing an organic EL display panel according to an aspect of the present invention, the third step may include adjusting an impact location within each aperture of each drop ejected by each nozzle in each nozzle group so that the impact locations of the drops in each aperture are dispersed.

In the method of manufacturing an organic EL display panel according to an aspect of the present invention, the third step may include adjusting an impact location within each aperture of each drop ejected by each nozzle in each nozzle group so that the impact locations of the drops in each aperture are symmetrical with respect to a line traversing a center of each aperture in a same column.

In the method of manufacturing an organic EL display panel according to an aspect of the present invention, each aperture may be elongated in a columnar direction.

An apparatus for manufacturing an organic EL display panel according to an aspect of the present invention comprises: an inkjet head having arranged thereon a row of a plurality of nozzles that eject drops of ink including organic material and solvent; a drop volume detection unit configured to detect a volume per drop of the drops ejected by each nozzle; a head scanning unit configured to cause the inkjet head to scan, in a direction of rows, an EL substrate provided with a layer of banks defining a plurality of apertures arranged in a matrix in one-to-one correspondence with pixels; and an ejection number control unit configured to determine an ejection number of drops to be ejected by each nozzle and to cause each nozzle to eject a number of drops equal to the determined ejection number, wherein a predetermined number of nozzles is allocated to each aperture by dividing the plurality of nozzles into nozzle groups and assigning one of the nozzle groups to each aperture, and the ejection number control unit determines the ejection number for each nozzle in accordance with variation in the detected volume per drop for each nozzle as detected by the drop volume detection unit, so that a total volume of the drops to be ejected into each aperture falls within a reference range.

In the apparatus for manufacturing an organic EL display panel according to an aspect of the present invention, each pixel may be a subpixel corresponding to a predetermined luminescent color, and a target value of the total volume of the drops to be ejected into each aperture may be set for each luminescent color. In each aperture into which drops of ink including the organic material of a same luminescent color are ejected, the target value may be within ±2% of the reference range.

Embodiment 1
Overall Configuration

FIG. 1 is a partial cross-section diagram showing the structure of an organic EL display panel 100 according to Embodiment 1. The organic EL display panel 100 is a top-emission display panel, with display being towards the upper side of FIG. 1.

As shown in FIG. 1, a TFT layer 2, power supply electrodes 3, a planarizing film 4, pixel electrodes 6, and a hole injection layer 9 are laminated in this order on a substrate (EL substrate) 1. A layer of banks 7 is provided on the hole injection layer 9. The layer of banks 7 includes a plurality of apertures 17 corresponding to regions for forming the organic light-emitting layers 11. In each aperture 17, a hole transport layer 10, the organic light-emitting layer 11, an electron transport layer 12, an electron injection layer 13, and an opposing electrode 14 are laminated in this order.

Substrate, TFT Layer, and Power Supply Electrodes

The substrate 1 is the back substrate in the organic EL display panel 100. The TFT layer 2 is formed on the surface of the substrate 1 and includes thin film transistors (TFTs) for driving the organic EL display panel 100 by an active matrix method. Power supply electrodes 3 are provided on the upper surface of the TFT layer 2 to provide power from an external source to each TFT.

Planarizing Film

The planarizing film 4 is for evening out surface differences resulting from provision of the TFT layer 2 and the power supply electrodes 3. The planarizing film 4 is formed from an organic material having excellent insulating properties.

Contact Holes

Contact holes 5 are provided for electrically connecting the power supply electrodes 3 with the pixel electrodes 6. The contact holes 5 are formed from the top surface to the back surface of the planarizing film 4. The contact holes 5 are formed at positions between the apertures 17, which are disposed in columns. The contact holes 5 are covered by the layer of banks 7. If not covered by the layer of banks 7, the contact holes 5 cause the organic light-emitting layer 11 to be uneven, leading to problems such as irregular light emission. The above structure is adopted to avoid such problems.

Pixel Electrodes

The pixel electrodes 6 are anodes provided in one-to-one correspondence with the organic light-emitting layer 11 formed in each aperture 17. Since the organic EL display panel 100 is a top-emission display panel, a highly reflective material is selected for the pixel electrodes 6.

Hole Injection Layer

The hole injection layer 9 is provided to promote injection of holes from the pixel electrodes 6 to the organic light-emitting layers 11.

Layer of Banks

When the organic light-emitting layers 11 are formed, the layer of banks 7 serves the function of preventing inks from running together, the inks including solvent and organic light-emitting layer material for each of the colors red (R), green (G), and blue (B).

The layer of banks 7 is provided so as to cover the top of the contact holes 5. A cross-section of one of the banks along the XY plane or the YZ plane is trapezoidal. At positions corresponding to the contact holes 5, however, the material for the layer of banks sinks downwards. Each sunken section is hereinafter referred to as a concavity 8.

Figure 2:
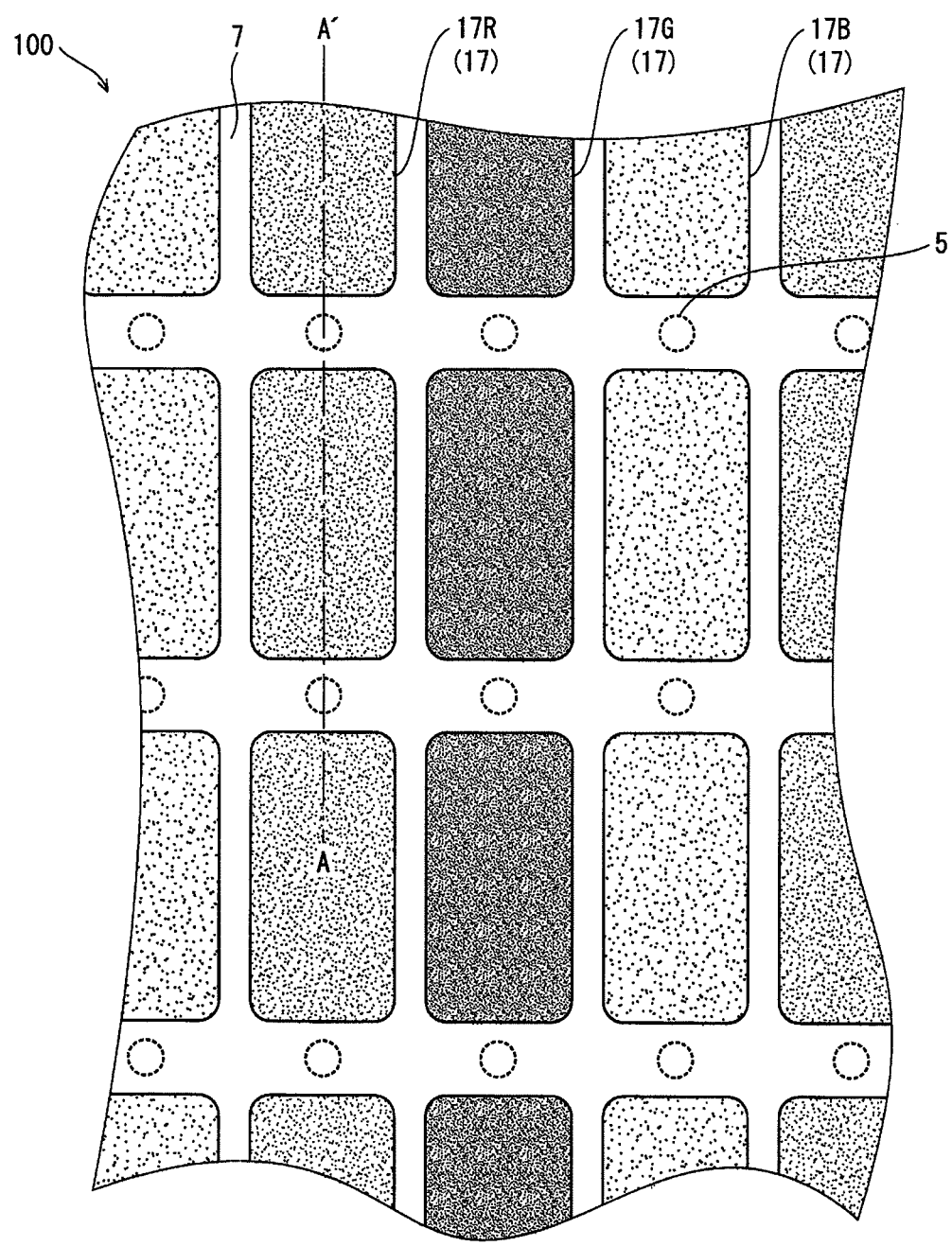
FIG. 2 is a schematic diagram showing the shape of banks in the organic EL display panel according to Embodiment 1.

FIG. 2 schematically shows the layer of banks 7 viewed from the display surface of the organic EL display panel 100. For the sake of explanation, the hole transport layers 10, the organic light-emitting layers 11, the electron transport layer 12, the electron injection layer 13, and the opposing electrode 14 are omitted from FIG. 2. The partial cross-section diagram in FIG. 1 corresponds to a cross-section diagram of A-A' in FIG. 2. Below, the X direction is treated as corresponding to rows and the Y direction to columns.

As shown in FIG. 2, the apertures 17 provided in the layer of banks 7 are arranged in a matrix (in the X and Y directions) corresponding to pixels. Each aperture 17 is a region for forming an organic light-emitting layer 11. The position and shape of the organic light-emitting layers 11 is thus determined by the position and shape of the apertures 17. Each aperture 17 is elongated in the column (Y) direction. The dimensions of each aperture 17 are, for example, approximately 30-130 μm along the row (X) direction and 150-600 μm along the column (Y) direction.

The apertures 17 include apertures 17R, 17G, and 17B corresponding to the colors R, G, and B respectively. Organic light-emitting layers 11 corresponding to the colors R, G, and B are respectively formed in the apertures 17R, the apertures 17G, and the apertures 17B. The apertures 17R, 17G, and 17B are sub-pixels, and a set of an aperture 17R, an aperture 17G, and an aperture 17B corresponds to one pixel. The apertures 17 are arranged in columns each of one color R, G, or B, so that every aperture 17 in a given column corresponds to the same color.

The contact holes 5 are located between the apertures 17 thus arranged in columns. In other words, the contact holes 5 are located below the layer of banks 7. The pixel electrodes 6 have been described as being formed individually for each organic light-emitting layer 11 in each aperture 17. This means that a pixel electrode 6 is provided for each sub-pixel.

Hole Transport Layers

Returning now to the partial cross-section diagram in FIG. 1, the hole transport layers 10 serve the function of transporting holes injected from the pixel electrodes 6 to the organic light-emitting layers 11.

Organic Light-Emitting Layers

The organic light-emitting layers 11 are where light is emitted by recombination of carriers (holes and electrons) and include organic material corresponding to one of the colors R, G, and B. The organic light-emitting layers 11 include organic material corresponding to the color R in the aperture 17R, organic material corresponding to the color G in the aperture 17G, and organic material corresponding to the color B in the aperture 17B.

An organic layer 16, including material for forming the organic light-emitting layer 11, is provided in each concavity 8. The organic layers 16 are formed at the same time as the organic light-emitting layers 11 by applying ink to the concavities 8 as well as to the apertures 17.

Electron Transport Layer

The electron transport layer 12 serves the function of transporting electrons injected from the opposing electrode 14 to the organic light-emitting layers 11.

Electron Injection Layer

The electron injection layer 13 serves the function of promoting injection of electrons from the opposing electrode 14 to the organic light-emitting layer 11.

Opposing Electrode

The opposing electrode 14 is a cathode. Since the organic EL display panel 100 is a top-emission display panel, a translucent material is selected for the opposing electrode 14.

Other

While not shown in FIG. 1, a passivation layer is provided above the opposing electrode 14 in order to prevent moisture, air, or the like from coming into contact with the organic light-emitting layer 11 and causing deterioration. Since the organic EL display panel 100 is a top-emission display panel, a translucent material is selected for the passivation layer, such as silicon nitride (SiN), silicon oxynitride (SiON), or the like.

Note that the organic light-emitting layer 11 formed in each aperture 17 may be of the same color.

Material for Each Layer

The following provides examples of the material for each of the above-described layers. Each of the layers may of course be formed with material other than the materials listed below.

Substrate 1: an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, or the like.

Planarizing film 4: polyimide resin, acrylic resin.

Pixel electrodes 6: Ag (silver); Al (aluminum); an alloy of silver, palladium, and copper; an alloy of silver, rubidium, and gold; MoCr (alloy of molybdenum and chromium); NiCr (alloy of nickel and chromium).

Layer of banks 7: acrylic resin, polyimide resin, novolac-type phenolic resin.

Organic light-emitting layers 11: a fluorescent material such as, for example, an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and azaquinolone compound, a pyrazoline derivative and pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of a 8-hydroxyquinoline compound, a metal complex of a 2-bipyridine compound, a complex of a Schiff base and a group three metal, a metal complex of oxine, a rare earth metal complex, or the like (all disclosed in Japanese Patent Application Publication No. H5-163488).

Hole injection layer 9: metal oxide, metal nitride, or metal oxynitride of MoOx (molybdenum oxide), WOx (tungsten oxide), MoxWyOz (molybdenum tungsten oxide), or the like.

Hole transport layers 10: a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound, a styrylamine compound, a butadiene compound, a polystyrene derivative, a hydrazone derivative, a triphenylmethane derivative, or a tetraphenylbenzene derivative (all disclosed in Japanese Patent Application Publication No. H5-163488).

Electron transport layer 12: barium, phthalocyanine, lithium fluoride.

Electron injection layer 13: a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative (all recited in Japanese Patent Application Publication No. H5-163488).

Opposing electrode 14: indium tin oxide (ITO), indium zinc oxide (IZO).

This concludes the description of the structure of the organic EL display panel 100. Next, an example of a method of manufacturing the organic EL display panel 100 is described.

Method of Manufacturing

A general example of a method of manufacturing the organic EL display panel 100 is first described. The application process during the method of manufacturing is then described in detail.

Overview

Figure 3A:
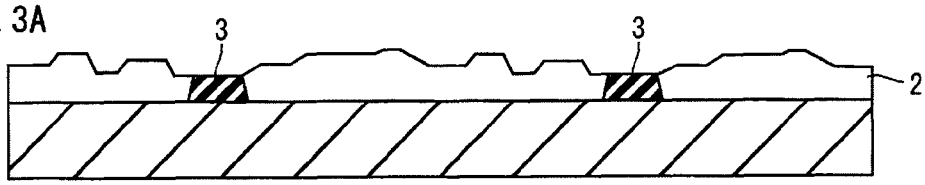
FIGS. 3A-3E show an example of processes for manufacturing the organic EL display panel according to Embodiment 1.

First, a substrate 1 with the TFT layer 2 and the power supply electrodes 3 formed thereon is prepared (FIG. 3A).

Figure 3B:
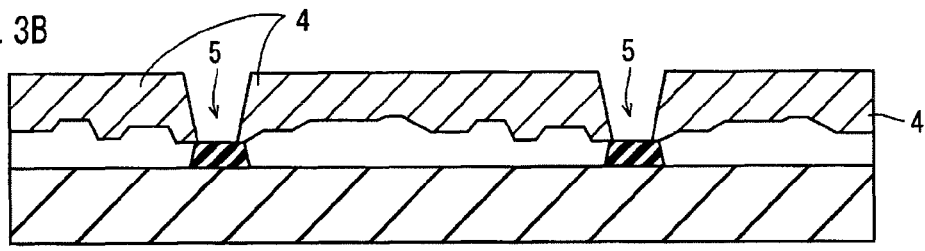

Subsequently, the planarizing film 4 is formed by the photoresist method to a thickness of approximately 4 μm on the TFT layer 2 and the power supply electrodes 3 from an organic material with an excellent insulating property. At this point, the contact holes 5 are formed at locations between apertures 17 in adjacent columns (FIG. 3B). The planarizing film 4 and the contact holes 5 can be formed simultaneously with the photoresist method by using an appropriate pattern mask. Formation of the contact holes 5 is of course not limited in this way, however. For example, after forming the planarizing film 4 to be uniform, the planarizing film 4 may be removed in predetermined locations in order to form the contact holes 5.

Figure 3C:
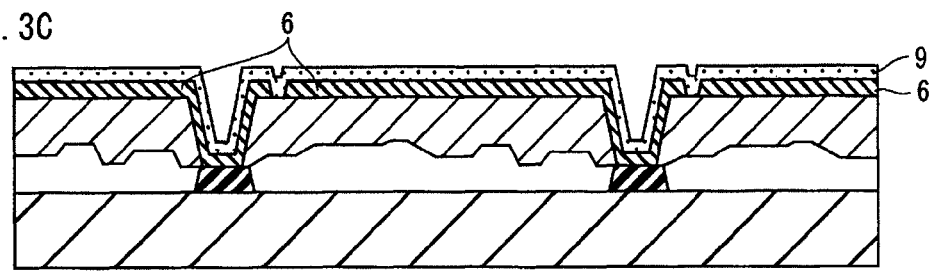

Next, the pixel electrodes 6 are formed by vacuum deposition or sputtering from a metal material to a thickness of approximately 150 nm. The pixel electrodes 6 are formed in each sub-pixel in electrical connection with the power supply electrodes 3. The hole injection layer 9 is then formed by reactive sputtering (FIG. 3C).

Figure 3D:
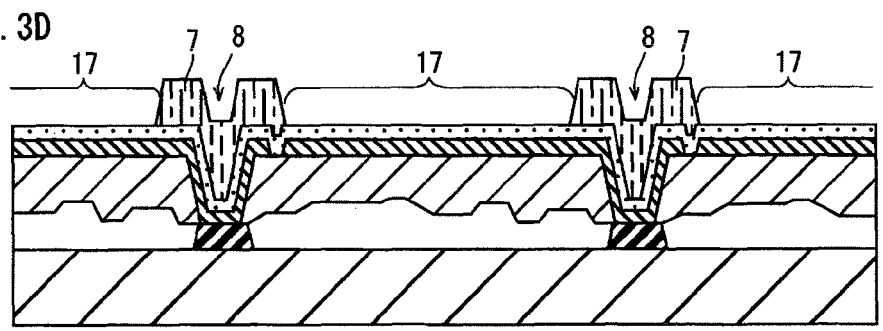

Next, the layer of banks 7 is formed by photolithography. Material for the layer of banks is first formed as a paste including photoresist material. The material for the layer of banks is applied evenly above the hole injection layer 9. A mask having the pattern for the apertures 17 shown in FIG. 2 is then layered thereabove. Light is shone from above the mask to form the pattern of the layer of banks. Subsequently, excess material for the layer of banks is washed off with aqueous or non-aqueous etchant (developer). Patterning of the material for the layer of banks is thus complete. The above process both defines the apertures 17, which are the regions for forming the organic light-emitting layers, while also forming concavities 8 on the upper surface between apertures 17 in adjacent columns. This completes formation of the layer of banks 7 whose surface is at least water repellent (FIG. 3D). When the contact holes 5 are formed as in the present embodiment, the material for the layer of banks normally enters into the contact holes 5. The concavities 8 thus form naturally. As a result, no separate process for formation of the concavities 8 is necessary, thereby reducing production costs and increasing manufacturing efficiency.

Note that during formation of the layer of banks 7, in order to adjust the contact angle between the ink applied to the apertures 17 and the layer of banks 7, or to provide the surface with water repellency, the surface of the layer of banks 7 may be treated with water, an organic solvent, a predetermined alkaline solution, or the like. The surface may also be plasma treated.

Figure 3E:
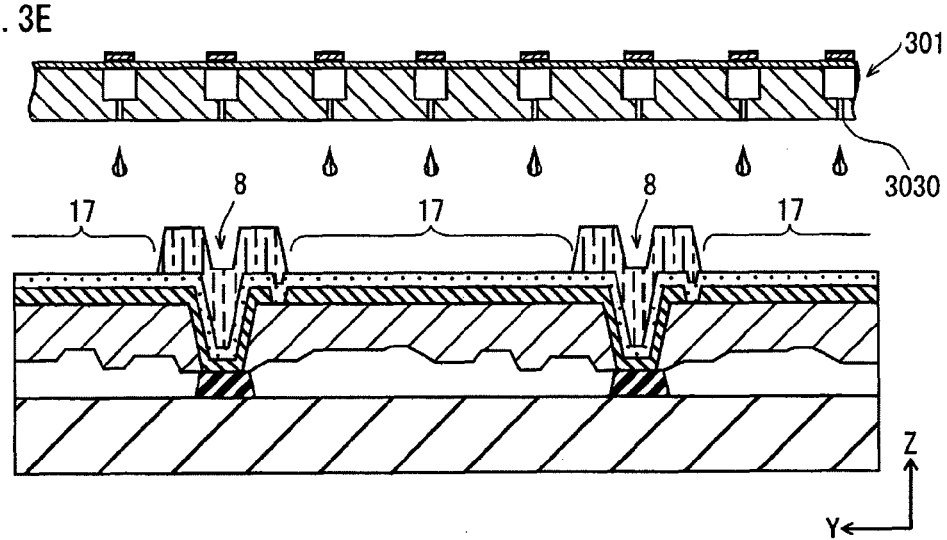
Figure 4A:
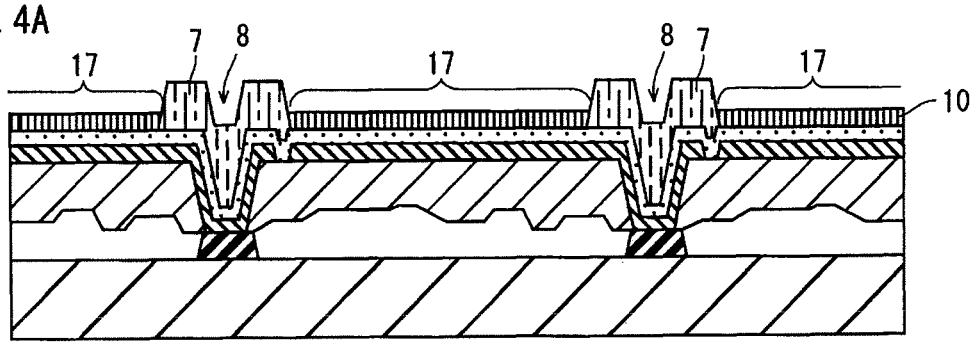
FIGS. 4A-4D show an example of processes for manufacturing the organic EL display panel according to Embodiment 1.

Next, organic material for the hole transport layers 10 is mixed with solvent in a predetermined ratio to prepare ink for the hole transport layers. This ink is provided to a head section 301, and based on the application process, nozzles 3030 corresponding to the apertures 17 eject drops 19 composed of the ink for the hole transport layers (FIG. 3E). Subsequently, the solvent included in the ink is dried by evaporation, and the result is baked as necessary to form the hole transport layers 10 (FIG. 4A).

Figure 4B:
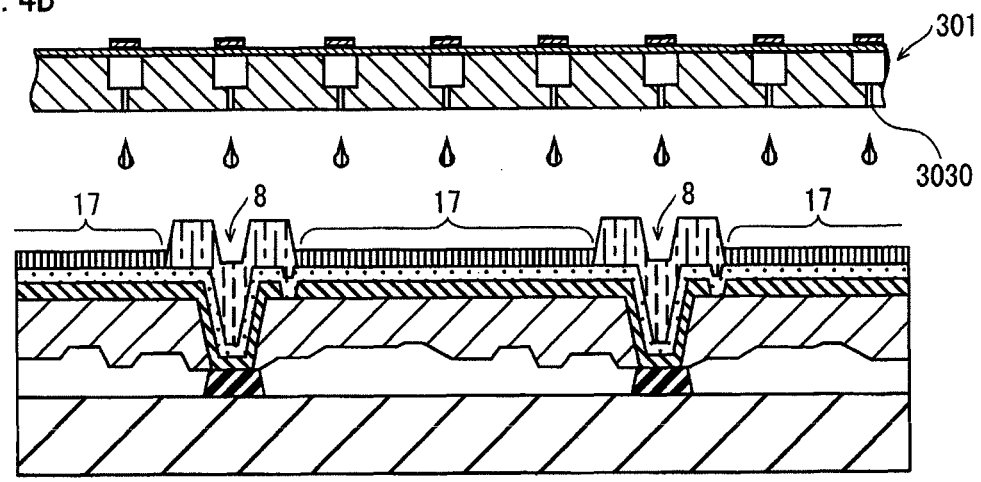
Figure 4C:
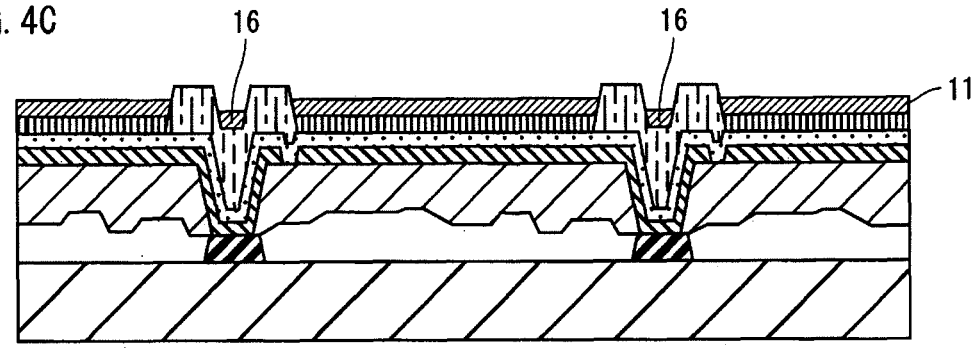

Organic material for the organic light-emitting layer 11 is then mixed with solvent in a predetermined ratio to prepare ink for the organic light-emitting layers. This ink is provided to the head section 301, and based on the application process, nozzles 3030 corresponding to the apertures 17 and the concavities 8 eject drops 18 composed of the ink for the organic light-emitting layer (FIG. 4B). Subsequently, the solvent included in the ink is dried by evaporation and then baked as necessary to form the organic light-emitting layers 11 and the organic layers 16 from the same material as the organic light-emitting layers 11 (FIG. 4C).

In FIG. 4B, drops of the ink for the organic light-emitting layer are ejected not only into the apertures 17 but also the concavities 8 in order to prevent the nozzles from becoming clogged. Ink used for formation of the organic light-emitting layers and the hole transport layers typically has a higher viscosity than ink for printing used in an inkjet printer. Therefore, if the nozzles were set not to eject ink, ink would congeal within the nozzles, leading to the problem of clogging. If a nozzle becomes clogged, the nozzle cannot eject a set amount of ink within a set time. If a predetermined volume of ink cannot be ejected into the apertures 17, loss may occur in the substrate, and the head section 301 may need replacement. In such a case, it is necessary to remove and clean the head section 301, and then to reattach the head section 301 while aligning it to a high degree of precision. Such operations reduce production efficiency. The above structure, however, prevents such problems from occurring.

Furthermore, in regions of the apertures 17 near the contact holes 5, evaporation of the solvent progresses faster than in other sections since the vapor concentration of the solvent is lower. If drying continues under uneven vapor concentration, the film will become thicker in regions where the solvent has a low vapor concentration, thus possibly preventing formation of a layer with an overall uniform thickness. Applying ink to both the apertures 17 and the concavities 8 as shown in FIG. 4B, however, increases the vapor concentration in regions near the contact holes 5. This results in a uniform vapor concentration for the solvent in the apertures 17, allowing for formation of organic light-emitting layers 11 having an even thickness throughout the apertures 17. This process therefore suppresses the occurrence of different types of irregular light emission, such as stripes or surface irregularities, thereby achieving excellent image display as compared to a conventional display panel.

During the application process shown in FIGS. 3E and 4B, a plurality of nozzles 3030 are divided into nozzle groups, with one nozzle group corresponding to one aperture 17, so that a predetermined number of nozzles are allocated to each aperture 17. Each nozzle group then ejects drops into the corresponding aperture 17. At this point, in the present embodiment, the total volume of the drops ejected into each aperture 17 is set to be within a reference range. As a result, the total volume of the drops ejected can be made even between apertures, thus reducing variation in luminance between pixels. Details are described below in the section on the "Application Procedure".

Figure 4D:
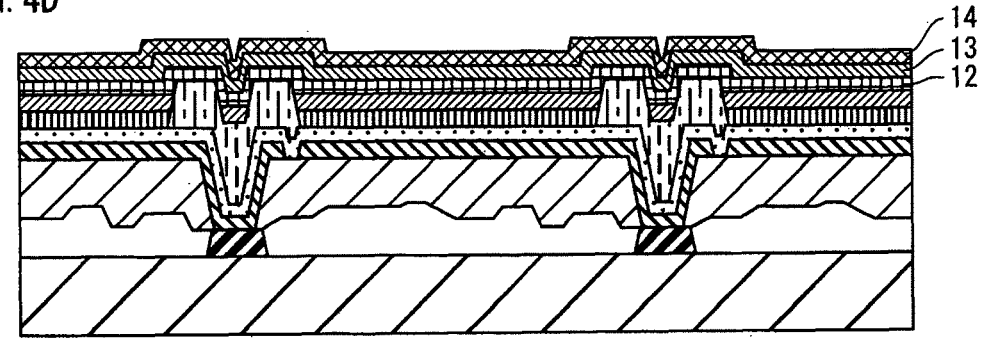

Next, on the surface of the organic light-emitting layers 11, a film of material for the electron transport layer 12 is formed by vacuum deposition. The electron transport layer 12 is thus formed. Subsequently, a film of material for the electron injection layer 13 is formed by a method such as deposition, spin coating, casting, or the like, in order to form the electron injection layer 13. A film is then formed from ITO, IZO, or the like by vacuum deposition or sputtering. The opposing electrode 14 is thus formed (FIG. 4D).

While not shown in the figures, a film of a translucent material, such as SiN, SiON, or the like, is formed on the surface of the opposing electrode 14 by a method such as sputtering or CVD, in order to form the passivation layer.

Formation of the organic EL display panel 100 is complete after the above processes.

Application Process

The following provides a detailed description of the application process for forming the hole transport layers 10 and the organic light-emitting layers 11. First, the inkjet apparatus (manufacturing apparatus) used in the application process is described.

Inkjet Apparatus

Figure 5:
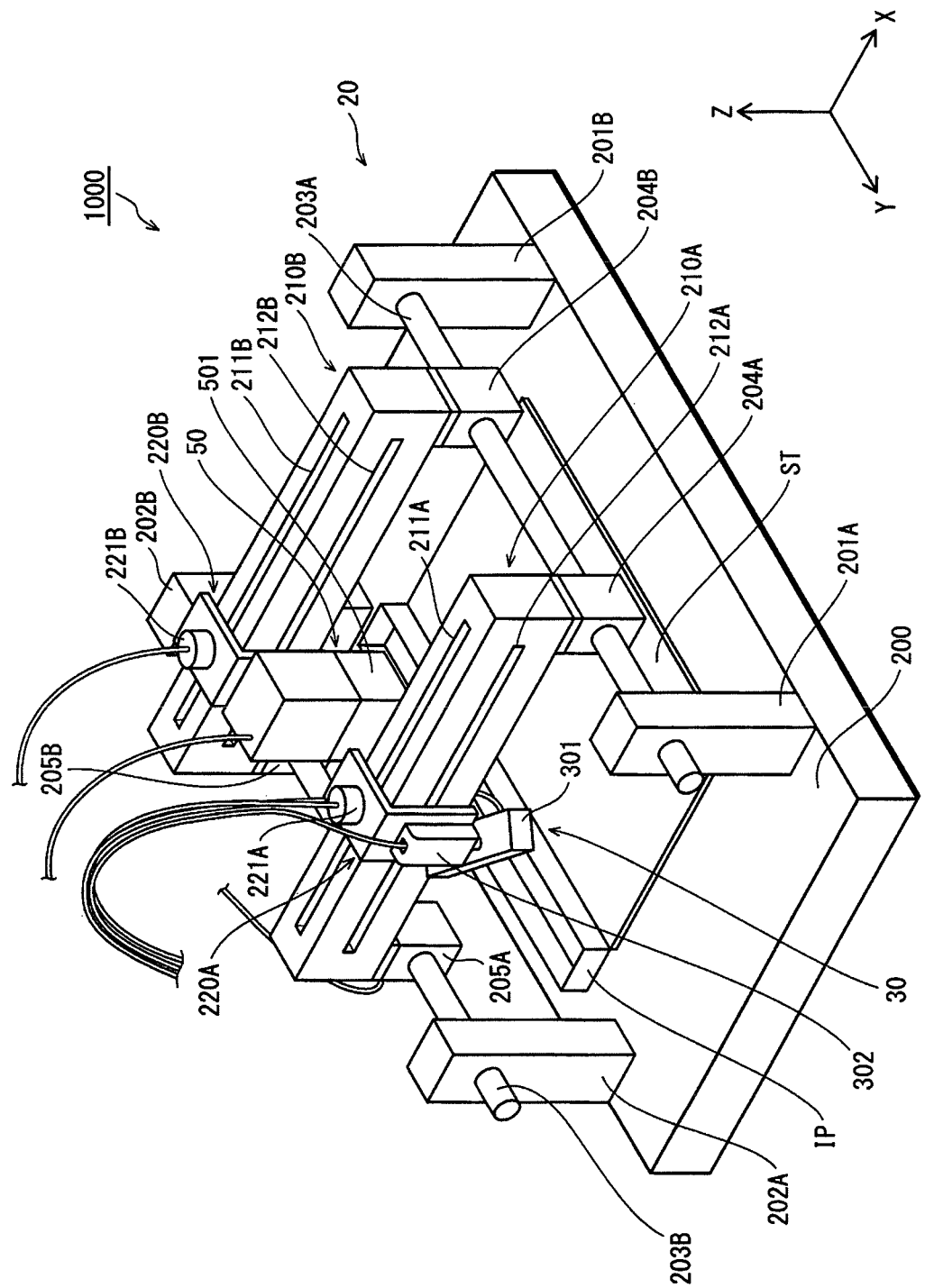
FIG. 5 shows the main structure of an inkjet apparatus.
Figure 6:
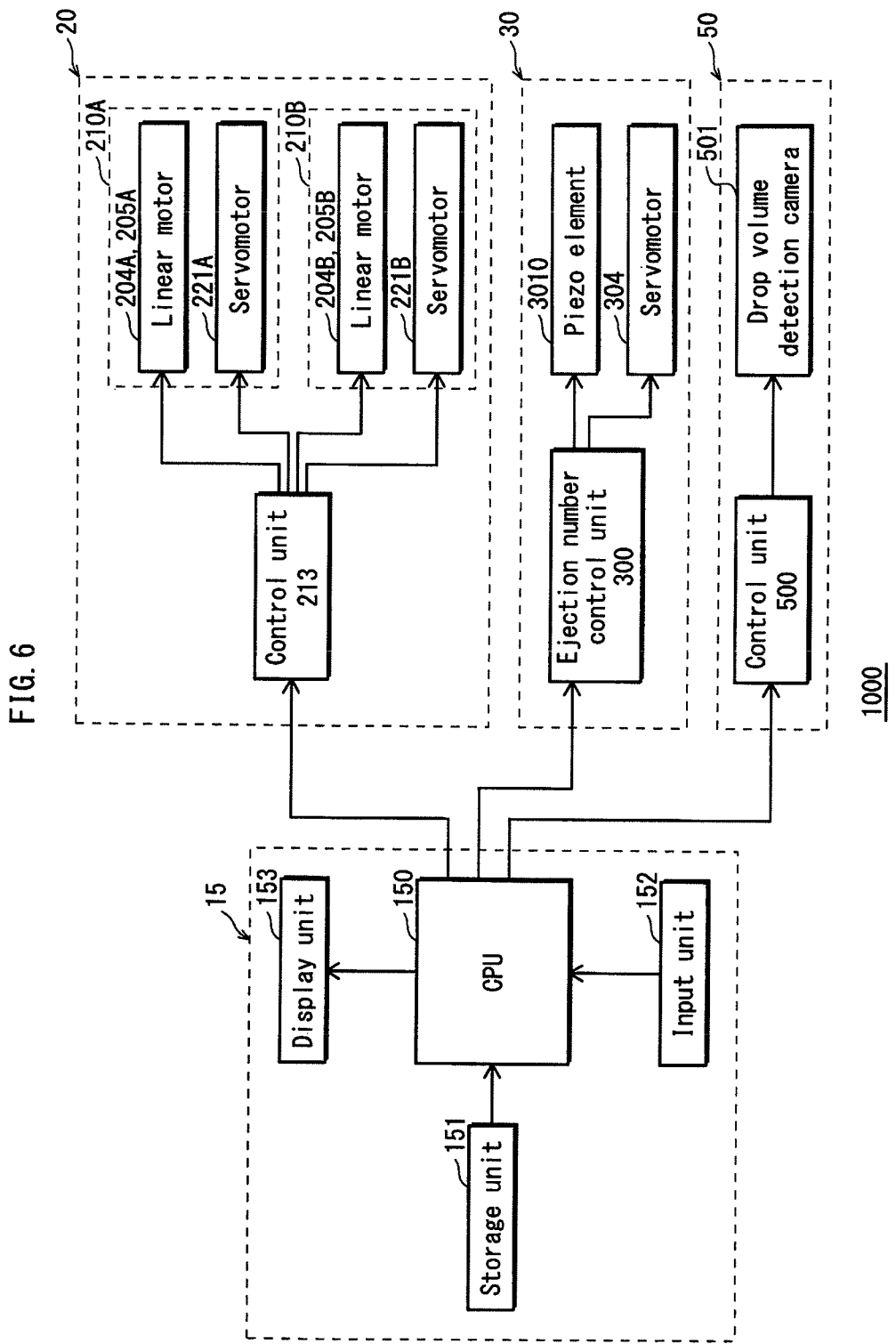
FIG. 6 is a functional block diagram of the inkjet apparatus.

FIG. 5 shows the main structure of an inkjet apparatus 1000 used in the present embodiment. FIG. 6 is a functional block diagram of the inkjet apparatus 1000.

As shown in FIGS. 5 and 6, the inkjet apparatus 1000 is formed by an inkjet table 20, an inkjet head 30, a drop volume detection unit 50, and a control device (PC) 15.

As shown in FIG. 6, the control device 15 includes a CPU 150, a storage unit 151 (which may be a large-scale storage unit such as an HDD), a display unit 153, and an input unit 152. The control device 15 may specifically be a personal computer (PC). The storage unit 151 stores control programs or the like for driving the inkjet table 20, the inkjet head 30, and the drop volume detection unit 50, which are connected to the control device 15. When driving the inkjet apparatus 1000, the CPU 150 performs predetermined control based on instructions input by an operator via the input unit 152 and on the control programs stored in the storage unit 151.

Inkjet Table

As shown in FIG. 5, the inkjet table 20 is a so-called gantry type work table in which two gantries (movable bridges) can move along a pair of guide shafts over the table base.

Specifically, columnar stands 201A, 201B, 202A, and 202B are provided at the four corners of the upper surface of a plate-shaped base 200. A fixed stage ST and an ink pan IP are provided in the region enclosed by the stands 201A, 201B, 202A, and 202B. The substrate subject to application is mounted on the fixed stage ST, whereas the ink pan IP is used to stabilize ejection of ink immediately before application.

Guide shafts 203A and 203B are provided lengthwise (in the Y direction) along opposite sides of the base 200 and are pivotally supported by the stands 201A, 201B, 202A, and 202B to be parallel. Each of the guide shafts is threaded through two linear motors (guide shaft 203A through linear motors 204A and 204B, and guide shaft 203B through linear motors 205A and 205B). A gantry 210A (210B) is mounted onto the linear motors 204A and 205A (204B and 205B) which form a pair, so that the gantry 210A (210B) traverses the base 200. With this structure, when the inkjet apparatus 1000 is driven, the two gantries 210A and 210B independently slide back and forth freely in the direction of length of the guideposts 203A and 203B as a result of the pair of linear motors 204A and 205A (204B and 205B) being driven.

Moveable bodies (carriages) 220A and 220B, formed by an L-shaped seating, are provided respectively on the gantries 210A and 210B. Servomotors 221A and 221B are respectively provided in the moveable bodies 220A and 220B. Gears, not shown in the figures, are provided at the tip of each motor's axle. The gears engage with guide grooves 211A and 211B along the direction of length (X direction) of the gantries 210A and 210B. Miniature racks are provided in the direction of length inside the guide grooves 211A and 211B. The moveable bodies 220A and 220B move back and forth precisely in the X direction by a so-called rack and pinion mechanism, wherein the gears mesh with the racks when the servomotors 221A and 221B are driven. The inkjet head 30 is mounted on the moveable body 220A, and the drop volume detection unit 50 is mounted on the moveable body 220B. The inkjet head 30 and the drop volume detection unit 50 are driven independently.

Together, the control unit 213 and the gantry 210A form a head scanning unit. Since the inkjet head 30 is mounted on the moveable body 220A, the head scanning unit can cause the inkjet head 30 to scan the substrate subject to application. When the movable body 220A moves in the X direction as described above, the scanning direction of the inkjet head 30 is in the row (X) direction.

The linear motors 204A, 205A, 204B, and 205B and the servomotors 221A and 221B are connected to a control unit 213 for directly controlling the driving of these motors. The control unit 213 is connected to the CPU 150 in the control device 15. When the inkjet apparatus 1000 is driven, the CPU 150, which has read the control programs, controls driving of the linear motors 204A, 205A, 204B, and 205B and of the servomotors 221A and 221B via the control unit 213 (FIG. 6).

Inkjet Head

A well-known piezo method is adopted in the inkjet head 30, which is formed by the head section 301 and a main body 302. The head section 301 is fixed to the moveable body 220 via the main body 302. The servomotor 304 (FIG. 6) is internal to the main body 302. Rotating the servomotor 304 adjusts the angle between the direction of length of the head section 301 and the X axis of the fixed stage ST. In the present embodiment, the direction of length of the head section 301 is adjusted to align with the Y axis.

A plurality of nozzles are provided on the head section 301, on a surface thereof facing the fixed stage ST. These nozzles are arranged in columns in the direction of length of the head section 301. The ink provided to the head section 301 is ejected in drops through each nozzle onto the substrate subject to application.

Operations for each nozzle to eject drops are controlled by providing driving voltage to a piezo element 3010 (FIG. 6) included in each nozzle. By controlling the drive signal provided to each piezo element 3010, an ejection number control unit 300 determines the number of drops each nozzle 3030 ejects. The ejection number control unit 300 also causes each nozzle 3030 to eject the determined number of drops. Specifically, as shown in FIG. 6, the CPU 150 reads a predetermined control program from the storage unit 151 and instructs the ejection number control unit 300 to apply a predetermined voltage to a target piezo element 3010.

Drop Volume Detection Unit

The drop volume detection unit 50 is for detecting the volume of the drops ejected by each nozzle. As shown in FIGS. 5 and 6, the drop volume detection unit 50 is formed by a drop volume detection camera 501 and a control unit 500. The drop volume detection camera 501 uses a well-known eutectic-point laser microscope. The objective lens in the drop volume detection camera 501 is angled to be able to photograph the surface of the fixed stage ST in the inkjet apparatus 1000 from a perpendicular direction.

The control unit 500, which is connected to the drop volume detection camera 501, calculates the volume of drops of ink based on images consecutively photographed by the drop volume detection camera 501 at different focal lengths. Note that the control unit 500 is also connected to the CPU 150. Since the CPU 150 can also access the photographed images, the CPU 150 can also perform the above calculation.

The application process is performed by the inkjet method using the inkjet apparatus 1000 with the above structure. In the following description, the longer side of the elongated apertures 17 is assumed to be perpendicular to the scanning direction (row (X) direction) of the inkjet head 30. In other words, lateral application is described.

Positional Relationship Between the Head Section and the Apertures in the Substrate Subject to Application (Lateral Application)

Figure 7:
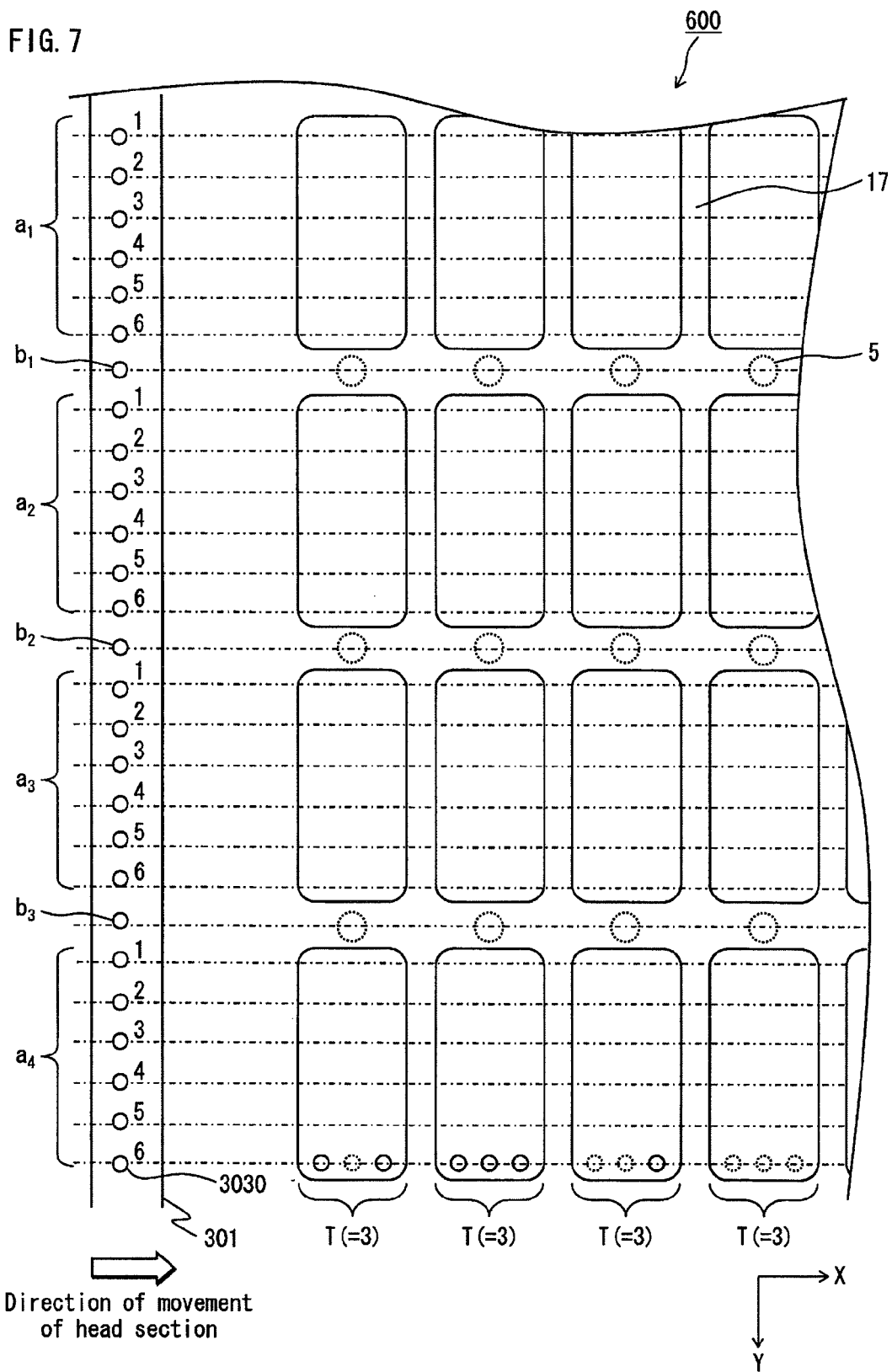
FIG. 7 shows the positional relationship between the substrate subject to application and the head section (during lateral application) in Embodiment 1.

FIG. 7 shows the positional relationship between the substrate subject to application and the head section (during lateral application) when manufacturing the organic EL display panel.

The reference number 600 in FIG. 7 indicates the substrate subject to application. The substrate is shown in the state just before the application process, i.e. including the layer of banks 7 with a plurality of apertures 17 in a matrix corresponding to pixels. A plurality of nozzles 3030 that eject ink are arranged in the head section 301 in a column. In order to allocate a predetermined number of the plurality of nozzles 3030 to each aperture 17 (in FIG. 7, six nozzles), the nozzles are divided into four nozzle groups $a_1$, $a_2$, $a_3$, and $a_4$, with one group corresponding to one aperture 17.

By slightly tilting the direction of length of the head section 301 with respect to the direction of the columns, the application pitch of the nozzles 3030 can be adjusted. In the example in FIG. 7, nozzles b1, b2, and b3 in the head section 301 correspond to the intervals (contact holes 5) provided between the apertures 17 in the direction of the columns. The nozzle groups $a_1$, $a_2$, $a_3$, and $a_4$ therefore correspond to the apertures 17 without a need to tilt the head section 301.

During the application process, the head section 301 is caused to scan in the row (X) direction, and the nozzles in the nozzle groups $a_1$, $a_2$, $a_3$, and $a_4$ are caused to eject drops of a desired ink into the corresponding apertures 17. The hole transport layers 10 and the organic light-emitting layers 11 are formed by completing this process. The total volume of the drops ejected during this process needs to be uniform between apertures 17.

Therefore, in the present embodiment, each nozzle 3030 in the nozzle groups $a_1$, $a_2$, $a_3$, and $a_4$ ejects drops into the corresponding apertures 17. In order for the total volume of the drops ejected into each aperture 17 to be within the reference range, the number of the drops ejected by each nozzle 3030 in the nozzle groups $a_1$, $a_2$, $a_3$, and $a_4$ is adjusted based on variation in the volume of drops detected for each nozzle 3030 by the drop volume detection unit 50. In other words, the volume of drops is compared to when each nozzle 3030 ejects a fixed number of drops. The number of drops ejected is then adjusted so that the total volume of drops ejected into each aperture 17 approaches a predetermined target value. The ejection number control unit 300 performs this adjustment of the number of drops ejected. Next, the control flow during the application process, including operations by the ejection number control unit 300, is described.

Control Flow of Inkjet Apparatus

Figure 8:
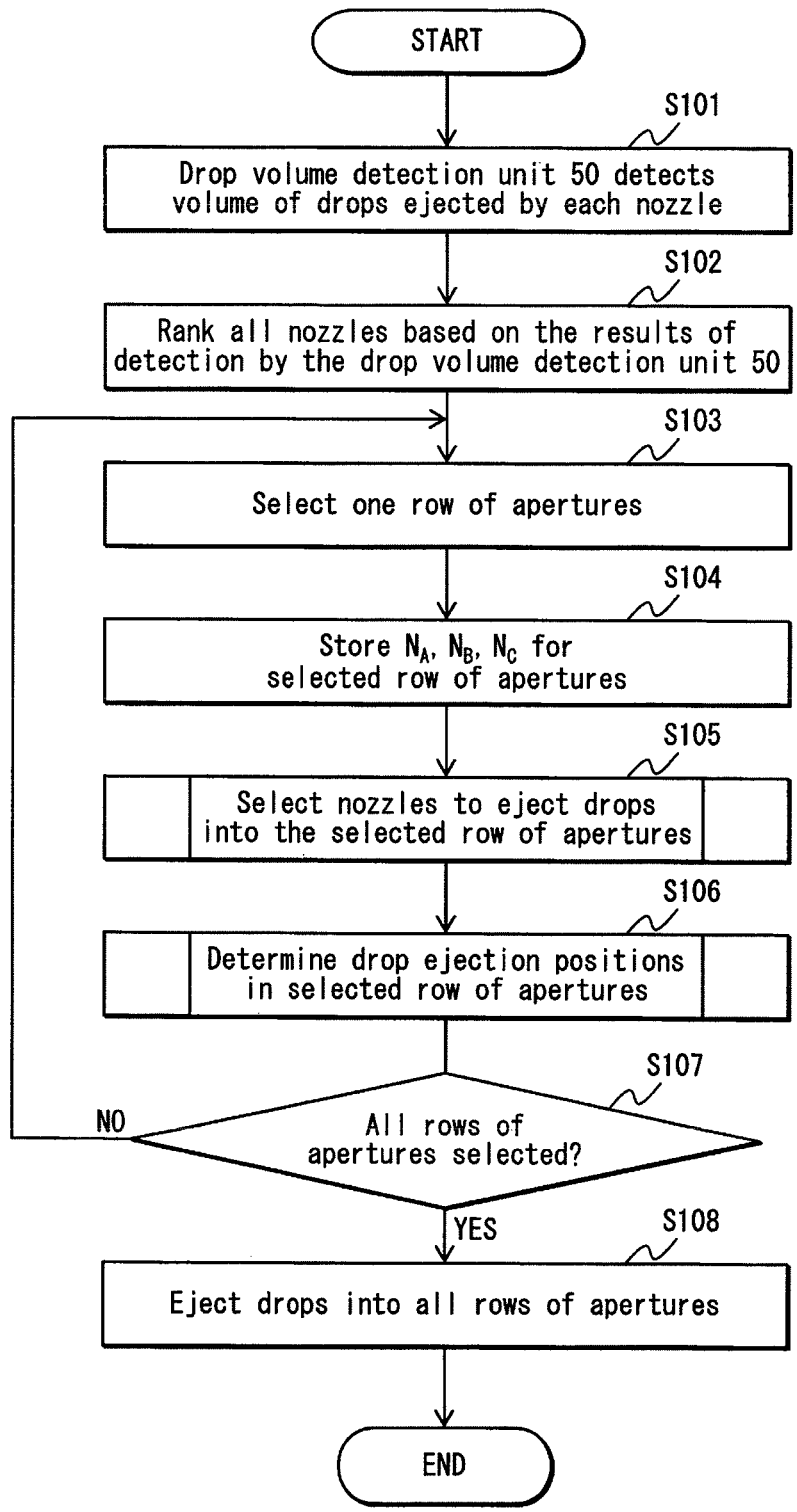
FIG. 8 shows the control flow during ejection in Embodiment 1.

FIG. 8 shows the control flow during the application process. For the sake of simplification, only the control flow for a predetermined column of apertures 17 is described. The control flow is similar for other columns of apertures 17.

The processes before the application process include preparation of the substrate subject to application, which includes the layer of banks 7 with a plurality of apertures 17 in a matrix corresponding to pixels. Before the application process, the inkjet head 30 (head section 301) is also prepared to have a plurality of nozzles 3030 arranged in a column, the nozzles 3030 ejecting drops of ink that includes organic material and solvent.

After the application process begins, the drop volume detection unit 50 detects the volume of drops ejected by each nozzle 3030 (step S101). Next, the ejection number control unit 300 ranks all of the nozzles 3030 in the head section 301 based on the results of detection by the drop volume detection unit 50 (step S102). In the present embodiment, by way of example, a preset value for the volume of the drop ejected by one nozzle per ejection is set to $V_{set}$, and nozzles are ranked by error with respect to $V_{set}$ as follows. A rank: error within ±a % of $V_{set}$. B rank: within ±b % (where a<b, and A rank nozzles are not included in the B rank). C rank: within ±c % (where b<c, and neither A nor B rank nozzles are included in the C rank). F rank: nozzle that cannot be used due to a reason such as clogging (non-ejecting nozzle).

Note that steps S101 and S102 need not be performed upon every application process. For example, these steps may be performed once per plurality of application processes, such as every ten application processes. Alternatively, steps S101 and S102 may be performed for each lot, or each time the inkjet apparatus 1000 is activated.

In the present embodiment, the number of ejections by each nozzle is adjusted so that the total volume of the drops ejected into each aperture 17 falls within the reference range. The values of a, b, and c above may be adjusted as needed to vary the scope of the reference range. Specifically, a target value for the total volume of the drops ejected into each aperture 17 is first set. The reference range is then determined as being within a certain percentage of the target value. Tolerance with respect to the target value depends on the degree to which luminance between pixels is to be made uniform.

For example, suppose that for apertures 17 with the above dimensions (30-130 μm×150-600 μm), the difference in luminance between apertures 17 is to be within 1%. The reference range is then ±2% of the target value of the total volume of the drops ejected into each aperture 17. The values of a, b, and c are determined taking into account the reference range and the number of drops ejected into each aperture 17. For example, in the above case, a is 1%-2%, b is 6%, and c is greater than 6%. Note that in a commercially available inkjet head, the error with respect to the above setting $V_{set}$ is approximately ±6%.

In an organic EL display panel, the thickness of the organic light-emitting layer 11 is extremely low: approximately 50 nm-100 nm. A minute variation in the volume of a drop results in a difference in luminance, thus greatly affecting display quality. As display panels have increasingly higher definition, there is a need for higher display quality. Variation between apertures in the volume of drops thus needs to be suppressed even further.

Next, the ejection number control unit 300 selects any row of apertures 17 (step S103). The ejection number control unit 300 stores the number of A rank nozzles $N_A$, the number of B rank nozzles $N_B$, and the number of C rank nozzles $N_C$ among the nozzles corresponding to the selected aperture 17 (step S104). The ejection number control unit 300 then selects the nozzles to eject drops into the selected row of apertures 17 (step S105) and determines the drop ejection positions (step S106).

Next, the ejection number control unit 300 determines whether all of the rows of apertures 17 have been selected (step S107). When determining that not all of the rows of apertures 17 have been selected (step S107: NO), the ejection number control unit 300 repeats the steps S103-S106 until processing has been performed for all rows of the apertures 17. When steps S103-S106 have been performed for all rows of the apertures 17 (step S107: YES), drops are ejected into all rows of the apertures 17 (step S108), thus completing the application process.

The process for selecting the nozzles to eject drops into the selected row of apertures 17 (step S105), as well as the process for determining the drop ejection positions for the selected row of apertures 17 (step S106), are now described in detail.

Process for Selecting Nozzles to Eject Drops

Figure 9:
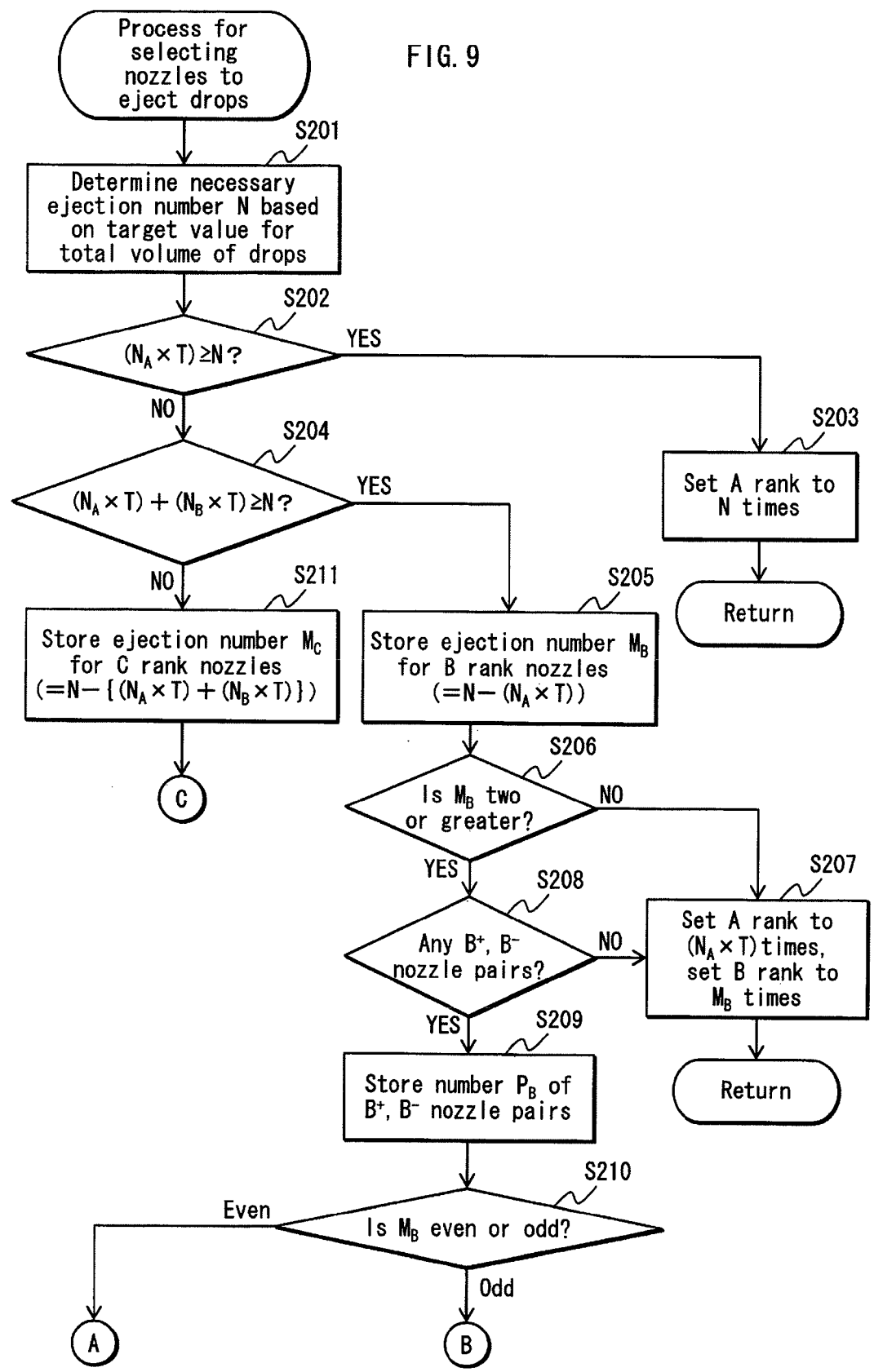
FIG. 9 shows the control flow of an ejection number control unit 300 during the process of selecting a nozzle for drop ejection.

FIG. 9 shows the control flow of the ejection number control unit 300 during the process of selecting nozzles for drop ejection (step S105 of FIG. 8).

Essentially, the control flow of the ejection number control unit 300 prioritizes use of A rank nozzles for drop ejection. When drops totaling at least the target value cannot be ejected with only A rank nozzles, drops are ejected into each aperture using A and B rank nozzles. When drops totaling at least the target value cannot be ejected with only A and B rank nozzles, drops are ejected into each aperture using A, B, and C rank nozzles.

In FIG. 9, the target value for the total volume of the drops ejected into each aperture 17 is set in advance. A number N indicating the number of ejections of a drop necessary for one aperture 17 (necessary ejection number N) is determined based on the target value (step S201). This target value varies depending on the type of ink that is applied. For example, in the case of ink for the organic light-emitting layer, the target value may vary by luminescent color. The necessary ejection number N is calculated by dividing the target value of the total volume of the drops ejected into each aperture 17 by the set value $V_{set}$. $V_{set}$ must be set to a value such that the necessary ejection number N is equal to or less than a maximum ejection number T, described below, multiplied by the number of nozzles for one aperture 17 (i.e. the number of nozzles in one nozzle group; six nozzles in FIG. 7).

Next, it is determined whether drops with a volume equal to or greater than the target value can be ejected with only A rank nozzles (step S202). Specifically, a maximum value T of the number of drops each nozzle can eject into one aperture (maximum ejection number T) is set in advance. It is determined whether the product of the maximum ejection number T and the number $N_A$ of A rank nozzles ($N_A \times T$) is greater than or equal to the necessary ejection number N. The maximum ejection number T for the sixth nozzle in the nozzle group $a_4$ in FIG. 7 is three. In the bottom row of apertures 17, a circle drawn with a solid line indicates a position at which a drop is ejected, whereas a circle drawn with a dotted line indicates a position at which a drop is not ejected.

When it is determined that $N_A \times T$ is greater than or equal to the necessary ejection number N (step S202: YES), drops with a volume equal to or greater than the target value can be ejected with only A rank nozzles. Therefore, the A rank nozzles are set to eject a drop N times (step S203). The process for selecting nozzles to eject drops is then terminated (step S105 in FIG. 8).

When it is determined that $N_A \times T$ is less than the necessary ejection number N (step S202: NO), drops with a volume equal to or greater than the target value cannot be ejected with only A rank nozzles. Therefore, it is then determined whether drops with a volume equal to or greater than the target value can be ejected with only A and B rank nozzles (step S204). Specifically, it is determined whether (($N_A \times T$)+($N_B \times T$)), i.e. the sum of ($N_A \times T$) and the product of the maximum ejection number T and the number $N_B$ of B rank nozzles, is greater than or equal to the necessary ejection number N.

When it is determined that (($N_A \times T$)+($N_B \times T$)) is greater than or equal to the necessary ejection number N (step S204: YES), drops with a volume equal to or greater than the target value can be ejected with A and B rank nozzles. Next, $M_B$ (=N−($N_A \times T$)), the number of ejections by the B rank nozzles, is stored (step S205).

It is then determined whether the ejection number $M_B$ stored in step S205 is two or greater (step S206). When the ejection number $M_B$ is not two or greater, i.e. when the ejection number $M_B$ is one (step S206: NO), the number of ejections by the A rank nozzles is set to ($N_A \times T$), and the number of ejections by the B rank nozzles is set to $M_B$ (i.e. to one in the case of performing step S207 after step S206) (step S207). The process for selecting nozzles to eject drops is then terminated.

When the ejection number $M_B$ is at least two (step S206: YES), it is determined whether the B rank nozzles include a pair of a nozzle having a larger ejection volume than the set value $V_{set}$ ($B^+$ nozzle) and a nozzle having a smaller ejection volume than the set value $V_{set}$ ($B^−$ nozzle) (step S208). Hereinafter, such a pair of nozzles is referred to as a $B^+$, $B^−$ nozzle pair. Step S208 is provided in the present embodiment because such a $B^+$, $B^−$ nozzle pair can be used to bring the total volume of drops closer to the reference range.

When there is no $B^+$, $B^−$ pair (step S208: NO), the number of ejections by the A rank nozzles is set to ($N_A \times T$), and the number of ejections by the B rank nozzles is set to $M_B$ (step S207). The process for selecting nozzles to eject drops is then terminated.

When a $B^+$, $B^−$ nozzle pair exists (step S208: YES), the number $P_B$ of $B^+$, $B^−$ nozzle pairs is stored (step S209). It is then determined whether the ejection number $M_B$ is even or odd (step S210).

Figure 10:
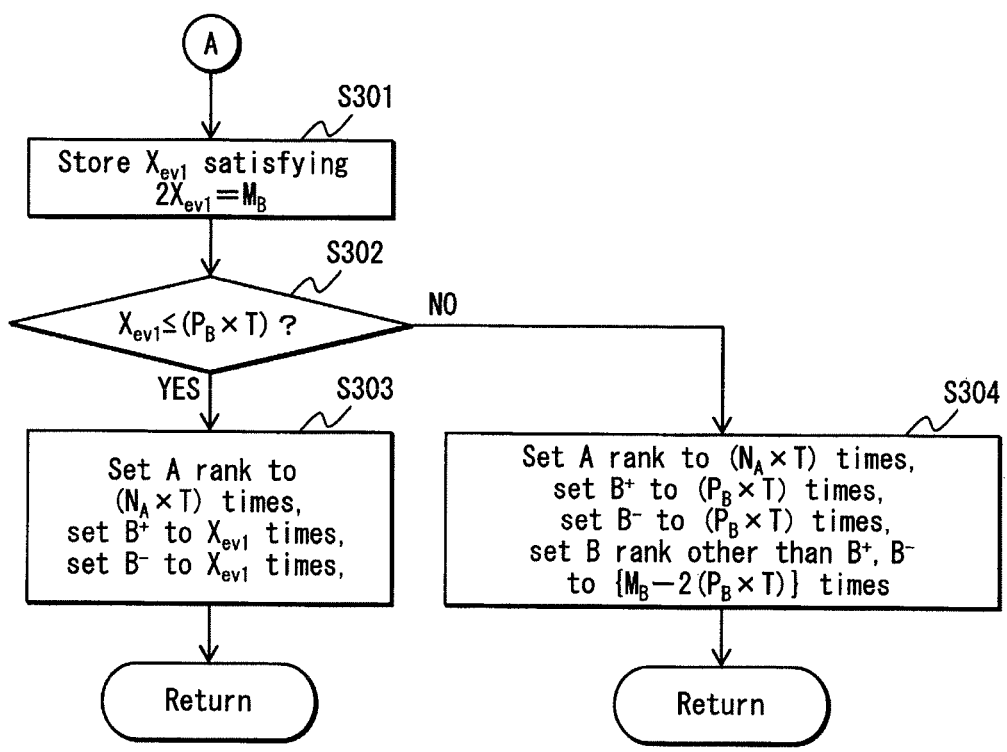
FIG. 10 shows the control flow for the ejection number control unit 300 when it is determined in step S210 of FIG. 9 that the ejection number $M_B$ is an even number.

FIG. 10 shows the control flow for the ejection number control unit 300 when it is determined in step S210 of FIG. 9 that the ejection number $M_B$ is an even number (step S210: even number).

First, within the ejection number $M_B$, the number of ejections possible with $B^+$, $B^−$ nozzle pairs is determined. Specifically, a value $X_{ev1}$ satisfying $2X_{ev1}=M_B$ is stored (step S301). It is then determined whether $X_{ev1} \leq (P_B \times T)$ (step S302). When ($P_B \times T$) is greater than or equal to $X_{ev1}$, i.e. when it is determined that $B^+$, $B^−$ nozzle pairs can be used to reach the ejection number $M_B$ (step S302: YES), processing proceeds to step S303. In step S303, the number of ejections by the A rank nozzles is set to ($N_A \times T$), and the number of ejections by the $B^+$ nozzles and the $B^−$ nozzles is set to $X_{ev1}$ each. The process for selecting nozzles to eject drops is then terminated.

On the other hand, when ($P_B \times T$) is less than $X_{ev1}$, i.e. when it is determined that the ejection number $M_B$ cannot be reached even by using $B^+$, $B^−$ nozzle pairs (step S302: NO), processing proceeds to step S304. In step S304, the number of ejections by the A rank nozzles is set to ($N_A \times T$), the number of ejections by the $B^+$ nozzles and the $B^−$ nozzles is set to ($P_B \times T$) each, and the number of ejections by B rank nozzles other than the $B^+$ nozzles and the $B^−$ nozzles is set to ($M_B − 2(P_B \times T)$). The process for selecting nozzles to eject drops is then terminated.

Figure 11:
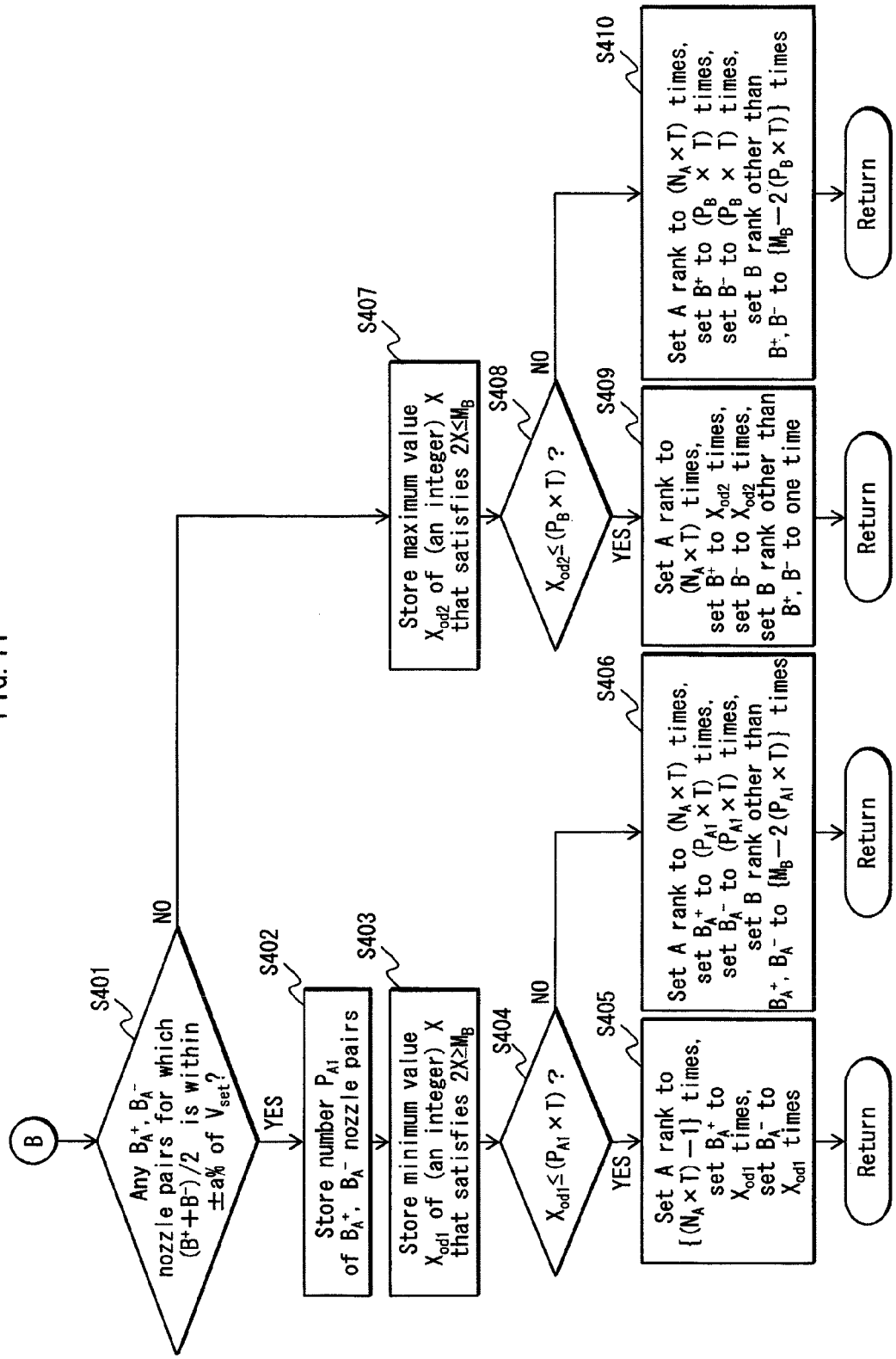
FIG. 11 shows the control flow for the ejection number control unit 300 when it is determined in step S210 of FIG. 9 that the ejection number $M_B$ is an odd number.

FIG. 11 shows the control flow for the ejection number control unit 300 when it is determined in step S210 of FIG. 9 that the ejection number MB is an odd number (step S210: odd number).

First, among the $B^+$, $B^-$ nozzle pairs, it is determined whether for any nozzle pair, the sum of the ejection volumes divided by two (the average ejection volume) is within the set value $V_{set}\pm a$ % (step S401). The nozzles in such a nozzle pair can effectively be considered A rank nozzles when used as a pair. Hereinafter, among the $B^+$, $B^-$ nozzle pairs, a pair of nozzles that can effectively be considered A rank nozzles are referred to as a $B_A^+$, $B_A^-$ nozzle pair. The nozzle having a larger ejection volume than the set value $V_{set}$ is the $B_A^+$ nozzle, and the nozzle having a smaller ejection volume than the set value $V_{set}$ is the $B_A^-$ nozzle. Step S401 is provided because, as with a $B^+$, $B^-$ nozzle pair, such a $B_A^+$, $B_A^-$ nozzle pair can be used to bring the total volume of drops closer to the reference range.

When it is determined that a $B_A^+$, $B_A^-$ nozzle pair exists (step S401: YES), the number $P_{A1}$ of $B_A^+$, $B_A^-$ nozzle pairs is stored (step S402).

Next, within the ejection number $M_B$, the number of ejections possible with $B_A^+$, $B_A^-$ nozzle pairs is determined. Specifically, the minimum value $X_{od1}$ of X that satisfies $2X \geq M_B$ (where X is an integer) is stored (step S403). It is then determined whether $X_{od1} \leq (P_{A1} \times T)$ (step S404). When $(P_{A1} \times T)$ is greater than or equal to $X_{od1}$, i.e. when it is determined that $B_A^+$, $B_A^-$ nozzle pairs can be used to reach the ejection number $M_B$ (step S404: YES), processing proceeds to step S405. In step S405, the number of ejections by the A rank nozzles is set to $((N_A \times T) - 1)$, and the number of ejections by the $B_A^+$ nozzles and the $B_A^-$ nozzles is set to $X_{od1}$ each. The process for selecting nozzles to eject drops is then terminated.

In step S405, the number of times A rank nozzles are used is reduced by one as a result of having completed step S403. All of the B rank nozzles that are used, however, can effectively be considered A rank nozzles. Therefore, the necessary ejection number N can be considered to be reached effectively by using A rank nozzles, thereby accurately bringing the total volume of drops closer to the target value.

On the other hand, when $(P_{A1} \times T)$ is less than $X_{od1}$, i.e. when it is determined that the ejection number $M_B$ cannot be reached even by using $B_A^+$, $B_A^-$ nozzle pairs (step S404: NO), processing proceeds to step S406. In step S406, the number of ejections by the A rank nozzles is set to $(N_A \times T)$, the number of ejections by the $B_A^+$ nozzles and the $B_A^-$ nozzles is set to $(P_{A1} \times T)$ each, and the number of ejections by B rank nozzles other than the $B_A^+$ nozzles and the $B_A^-$ nozzles is set to $(M_B - 2(P_{A1} \times T))$. The process for selecting nozzles to eject drops is then terminated.

Next, when it is determined that no $B_A^+$, $B_A^-$ nozzle pair exists (step S401: NO), within the ejection number $M_B$, the number of ejections possible with $B^+$, $B^-$ nozzle pairs is determined. Specifically, the maximum value $X_{od2}$ of X that satisfies $2X \leq M_B$ (where X is an integer) is stored (step S407). It is then determined whether $Xod2 \leq (P_B \times T)$ (step S408). When $(P_B \times T)$ is greater than or equal to $X_{od2}$, i.e. when it is determined that $B^+$, $B^-$ nozzle pairs can be used to reach the ejection number $M_B$ (step S408: YES), processing proceeds to step S409. In step S409, the number of ejections by the A rank nozzles is set to $(N_A \times T)$, the number of ejections by the $B^+$ nozzles and the $B^-$ nozzles is set to $X_{od2}$ each, and the number of ejections by B rank nozzles other than the $B^+$ nozzles and the B nozzles is set to one. The process for selecting nozzles to eject drops is then terminated.

On the other hand, when $(P_B \times T)$ is less than $X_{od2}$, i.e. when it is determined that the ejection number $M_B$ cannot be reached even by using $B^+$, $B^-$ nozzle pairs (step S408: NO), processing proceeds to step S410. In step S410, the number of ejections by the A rank nozzles is set to $(N_A \times T)$, the number of ejections by the B+ nozzles and the B− nozzles is set to $(P_B \times T)$ each, and the number of ejections by B rank nozzles other than the B+ nozzles and the B− nozzles is set to $(M_B - 2(P_B \times T))$. The process for selecting nozzles to eject drops is then terminated.

Note that the "B rank nozzles other than the $B_A^+$ nozzles and the $B_A^-$ nozzles" in step S406 includes the $B^+$, $B^-$ nozzle pairs. Accordingly, the control flow in steps S407-S410 can be applied to the $(M_B - 2(P_{A1} \times T))$ ejections by the "B rank nozzles other than the $B_A^+$ nozzles and the $B_A^-$ nozzles". The total volume of drops can thus be accurately brought closer to the target value.

Furthermore, in steps S409 and S410, the "B rank nozzles other than the $B^+$ nozzles and the $B^-$ nozzles" may include $B_A^+$ nozzles or $B_A^-$ nozzles. In this case, it is preferable to prioritize ejection of drops by the $B_A^+$ and $B_A^-$ nozzles.

Returning to FIG. 9, when it is determined that $((N_A \times T) + (N_B \times T))$ is less than the necessary ejection number N (step S204: NO), drops with a volume equal to or greater than the target value cannot be ejected with only A and B rank nozzles. Therefore, $M_C (= N - ((N_A \times T) + (N_B \times T)))$, the number of ejections by the C rank nozzles, is then stored (step S211).

Figure 12:
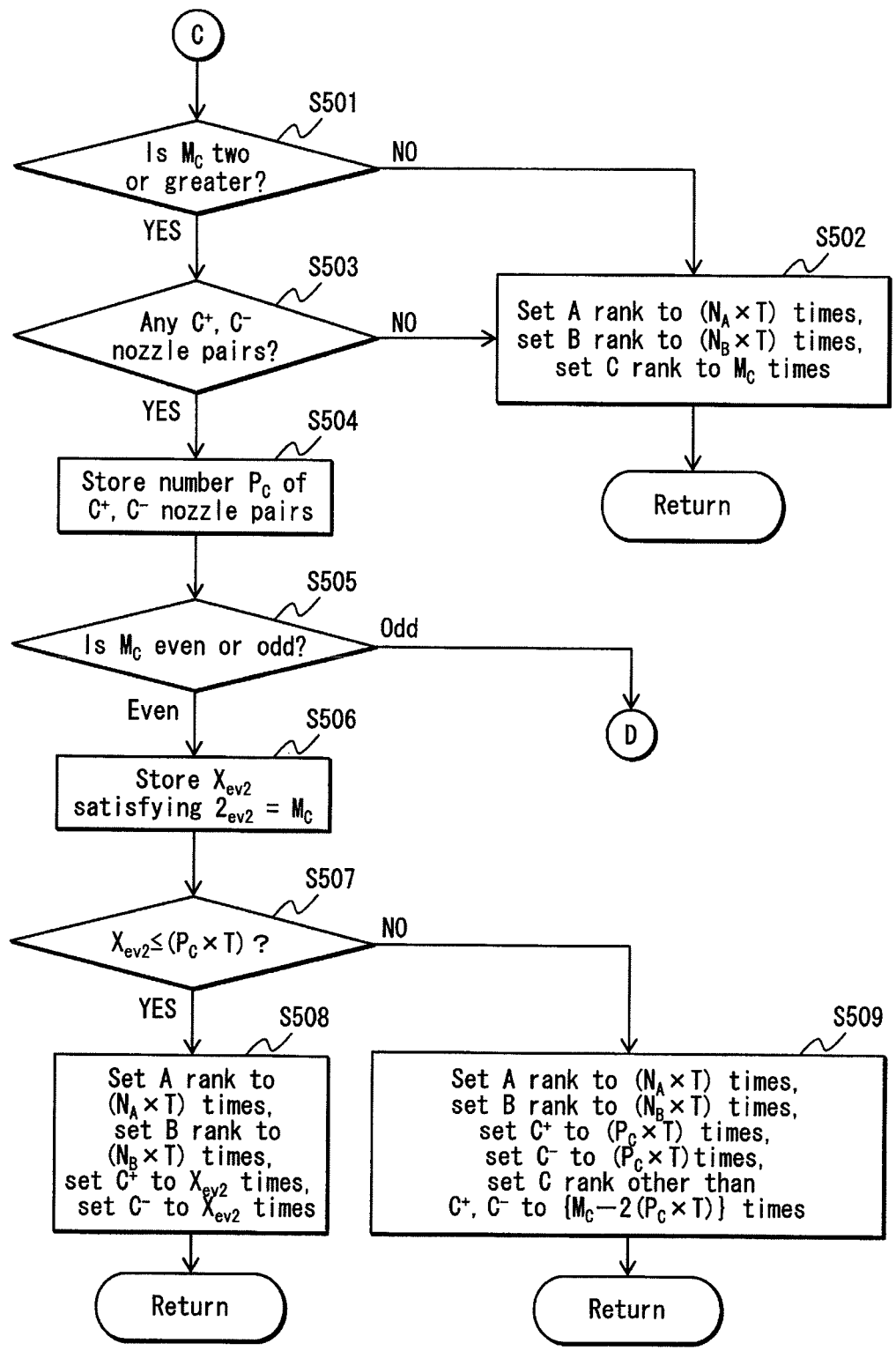
FIG. 12 shows the control flow for the ejection number control unit 300 when using C rank nozzles.

FIG. 12 shows the control flow for the ejection number control unit 300 when using C rank nozzles.

The control flow when using C rank nozzles can be described in approximately the same way as the control flow when using B rank nozzles as shown in FIG. 9 (steps S206-S210), FIG. 11, and FIG. 12. The following is a simple description of the control flow for the ejection number control unit 300 when using C rank nozzles.

First, it is determined whether the ejection number $M_C$ stored in step S211 is two or greater (step S501). When the ejection number $M_C$ is at least two (step S501: YES), it is determined whether the C rank nozzles include a pair of a nozzle having a larger ejection volume than the set value $V_{set}$ ($C^+$ nozzle) and a nozzle having a smaller ejection volume than the set value $V_{set}$ ($C^-$ nozzle) (step S503). When the ejection number $M_C$ is not two or greater (step S501: NO), or when it is determined that no $C^+$, $C^-$ nozzle pair exists (step S503: NO), the number of ejections by the A rank nozzles is set to $(N_A \times T)$, the number of ejections by the B rank nozzles is set to $(N_B \times T)$, the number of ejections by the C rank nozzles is set to $M_C$ (or to one in the case of performing step S502 after step S501) (step S502). The process for selecting nozzles to eject drops is then terminated.

When a $C^+$, $C^-$ nozzle pair exists (step S503: YES), the number $P_C$ of $C^+$, $C^-$ nozzle pairs is stored (step S504). It is then determined whether the ejection number $M_C$ is even or odd (step S505).

When it is determined that the ejection number $M_C$ is an even number (step S505: even number), a value $X_{ev2}$ satisfying $2X_{ev2} = M_C$ is stored (step S506). It is then determined whether $X_{ev2} \leq (P_C \times T)$ (step S507). When $(P_C \times T)$ is greater than or equal to $X_{ev2}$ (step S507: YES), processing proceeds to step S508. In step S508, the number of ejections by the A rank nozzles is set to $(N_A \times T)$, the number of ejections by the B rank nozzles is set to $(N_B \times T)$, and the number of ejections by the $C^+$ nozzles and the $C^-$ nozzles is set to each. The process for selecting nozzles to eject drops is then terminated.

On the other hand, when $(P_C \times T)$ is less than $X_{ev2}$ (step S507: NO), processing proceeds to step S509. In step S509, the number of ejections by the A rank nozzles is set to $(N_A \times T)$, the number of ejections by the B rank nozzles is set to $(N_B \times T)$, the number of ejections by the $C^+$ nozzles and the $C^-$ nozzles is set to ($P_C \times T$) each, and the number of ejections by the C rank nozzles other than the $C^+$ nozzles and the $C^-$ nozzles is set to ($M_C - 2(P_C \times T)$). The process for selecting nozzles to eject drops is then terminated.

Figure 13:
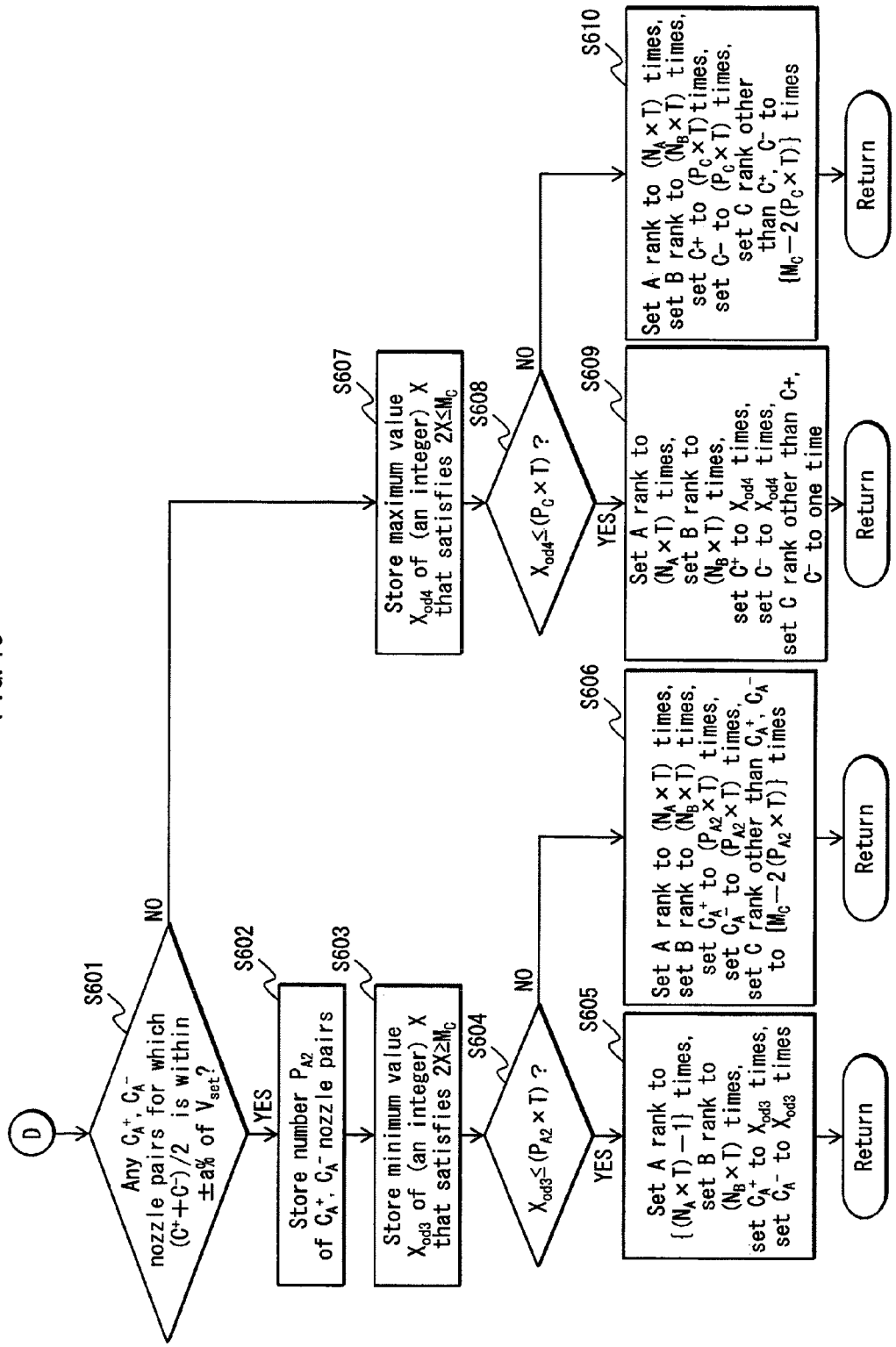
FIG. 13 shows the control flow for the ejection number control unit 300 when it is determined in step S505 of FIG. 12 that the ejection number $M_C$ is an odd number.

FIG. 13 shows the control flow for the ejection number control unit 300 when it is determined in step S505 of FIG. 12 that the ejection number $M_C$ is an odd number (step S505: odd number).

First, among the $C^+$, $C^-$ nozzle pairs, it is determined whether for any nozzle pair, the sum of the ejection volumes divided by two (i.e. the average ejection volume) is within the set value $V_{set} \pm a$ % (such a pair being referred to as a $C_A^+$, $C_A^-$ nozzle pair) (step S601). When it is determined that a $C_A^+$, $C_A^-$ nozzle pair exists (step S601: YES), the number $P_{A2}$ of $C_A^+$, $C_A^-$ nozzle pairs is stored (step S602).

Next, the minimum value $X_{od3}$ of X that satisfies $2X \geq M_C$ (where X is an integer) is stored (step S603). It is then determined whether $X_{od3} \leq (P_{A2} \times T)$ (step S604). When ($P_{A2} \times T$) is greater than or equal to $X_{od3}$ (step S604: YES), processing proceeds to step S605. In step S605, the number of ejections by the A rank nozzles is set to (($N_A \times T$)−1), the number of ejections by the B rank nozzles is set to ($N_B \times T$), and the number of ejections by the $C_A^+$ nozzles and the $C_A^-$ nozzles is set to $X_{od3}$ each. The process for selecting nozzles to eject drops is then terminated.

When ($P_{A2} \times T$) is less than $X_{od3}$ (step S604: NO), processing proceeds to step S606. In step S606, the number of ejections by the A rank nozzles is set to ($N_A \times T$), the number of ejections by the B rank nozzles is set to ($N_B \times T$), the number of ejections by the $C_A^+$ nozzles and the $C_A^-$ nozzles is set to ($P_{A2} \times T$) each, and the number of ejections by the C rank nozzles other than the $C_A^+$ nozzles and the $C_A^-$ nozzles is set to ($M_C - 2(P_{A2} \times T)$). The process for selecting nozzles to eject drops is then terminated.

Next, when it is determined that no $C_A^+$, $C_A^-$ nozzle pair exists (step S601: NO), the maximum value $X_{od4}$ of X that satisfies $2X \leq M_C$ (where X is an integer) is stored (step S607). It is then determined whether $X_{od4} \leq (P_C \times T)$ (step S608). When ($P_C \times T$) is greater than or equal to $X_{od4}$ (step S608: YES), processing proceeds to step S609. In step S609, the number of ejections by the A rank nozzles is set to ($N_A \times T$), the number of ejections by the B rank nozzles is set to ($N_B \times T$), the number of ejections by the $C^+$ nozzles and the $C^-$ nozzles is set to $X_{od4}$ each, and the number of ejections by the C rank nozzles other than the $C^+$ nozzles and the $C^-$ nozzles is set to one. The process for selecting nozzles to eject drops is then terminated.

When ($P_C \times T$) is less than $X_{od4}$ (step S608: NO), processing proceeds to step S610. In step S610, the number of ejections by the A rank nozzles is set to ($N_A \times T$), the number of ejections by the B rank nozzles is set to ($N_B \times T$), the number of ejections by the $C^+$ nozzles and the $C^-$ nozzles is set to ($P_C \times T$) each, and the number of ejections by the C rank nozzles other than the $C^+$ nozzles and the $C^-$ nozzles is set to ($M_C - 2(P_C \times T)$). The process for selecting nozzles to eject drops is then terminated.

Note that the "number of ejections by the C rank nozzles other than the $C_A^+$ nozzles and the $C_A^-$ nozzles" in step S606 includes the $C^+$, $C^-$ nozzle pairs. Accordingly, as in the control flow for the B rank nozzles, the control flow in steps S607-S610 can be applied to the "C rank nozzles other than the $C_A^+$ nozzles and the $C_A^-$ nozzles".

Furthermore, in steps S609 and S610, the "C rank nozzles other than the $C^+$ nozzles and the $C^-$ nozzles" may include $C_A^+$ nozzles or $C_A^-$ nozzles. In this case, it is preferable to prioritize ejection of drops by the $C_A^+$ and $C_A^-$ nozzles.

In step S203 (FIG. 9), when setting the number of ejections by A rank nozzles, the total number of ejections by nozzle #1 through nozzle #6 in a nozzle group is set. At this point, it is preferable to adjust the impact location of each drop ejected into the apertures 17 by the nozzles 3030 so that the impact locations are dispersed within each aperture 17. Specifically, the impact locations within one aperture 17 are adjusted to be symmetrical with respect to an axis parallel to the scanning direction. For example, when 14 drops are ejected into one aperture 17, the impact locations are adjusted so that seven drops are ejected into the upper half of the aperture 17 in the direction of the columns, and seven drops are ejected into the lower half.

Furthermore, as in step S207 (FIG. 9), steps S303 and S304 (FIG. 10), and steps S405, S406, S409, and S410 (FIG. 11), when a combination of A rank and B rank nozzles are used, the number of drops ejected by the A rank nozzles and by the B rank nozzles are adjusted to be approximately equal in the upper half and the lower half of the aperture 17 in the direction of the columns. The same is true in steps S502, S508, and S509 (FIG. 12) and steps S605, S606, S609, and S610 (FIG. 13), in which a combination of A, B, and C rank nozzles are used.

Process for Determining Drop Ejection Positions

Figure 14:
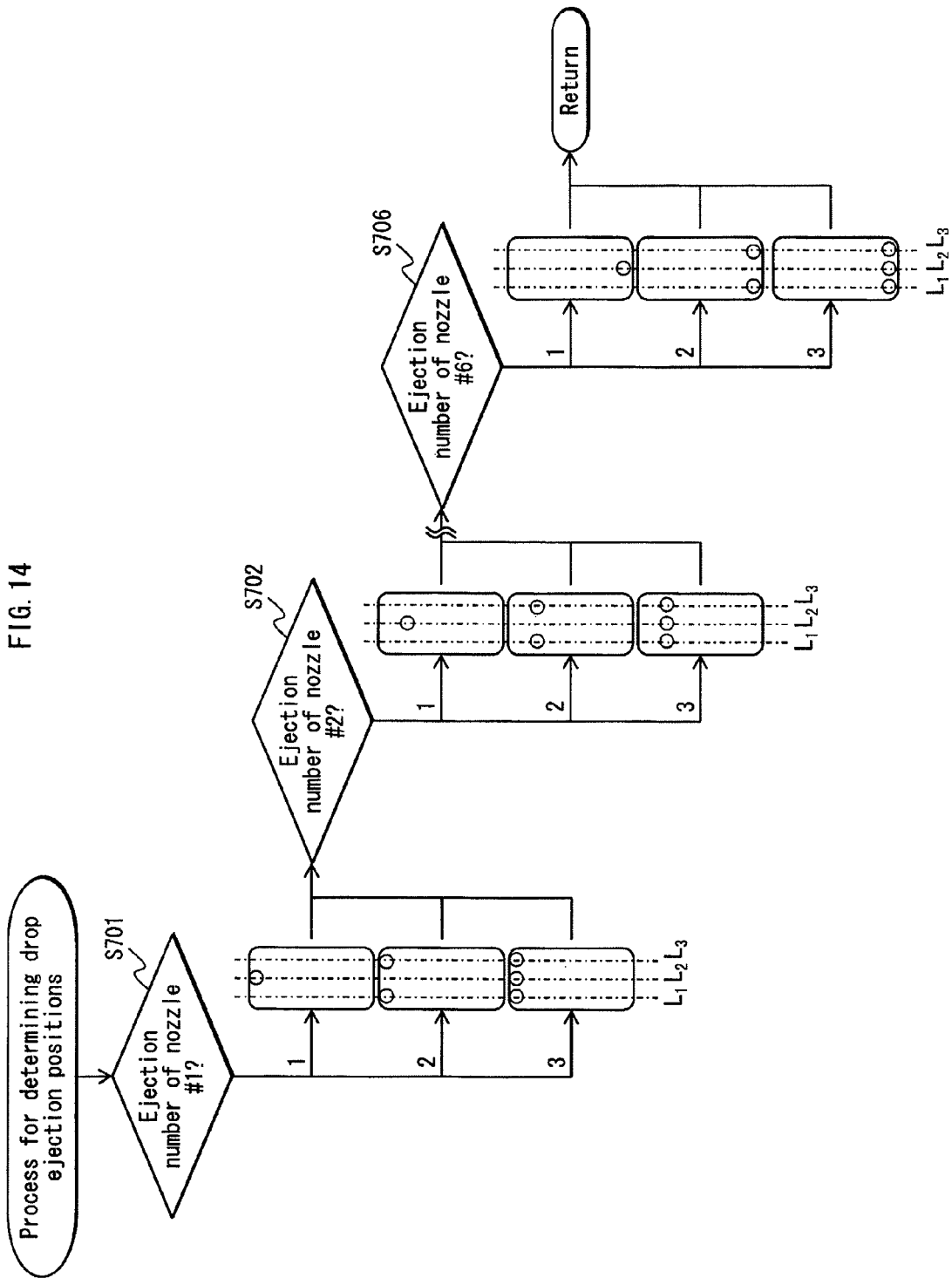
FIG. 14 shows the control flow for the ejection number control unit 300 when determining the drop ejection positions (maximum ejection number T=3).
Figure 15:
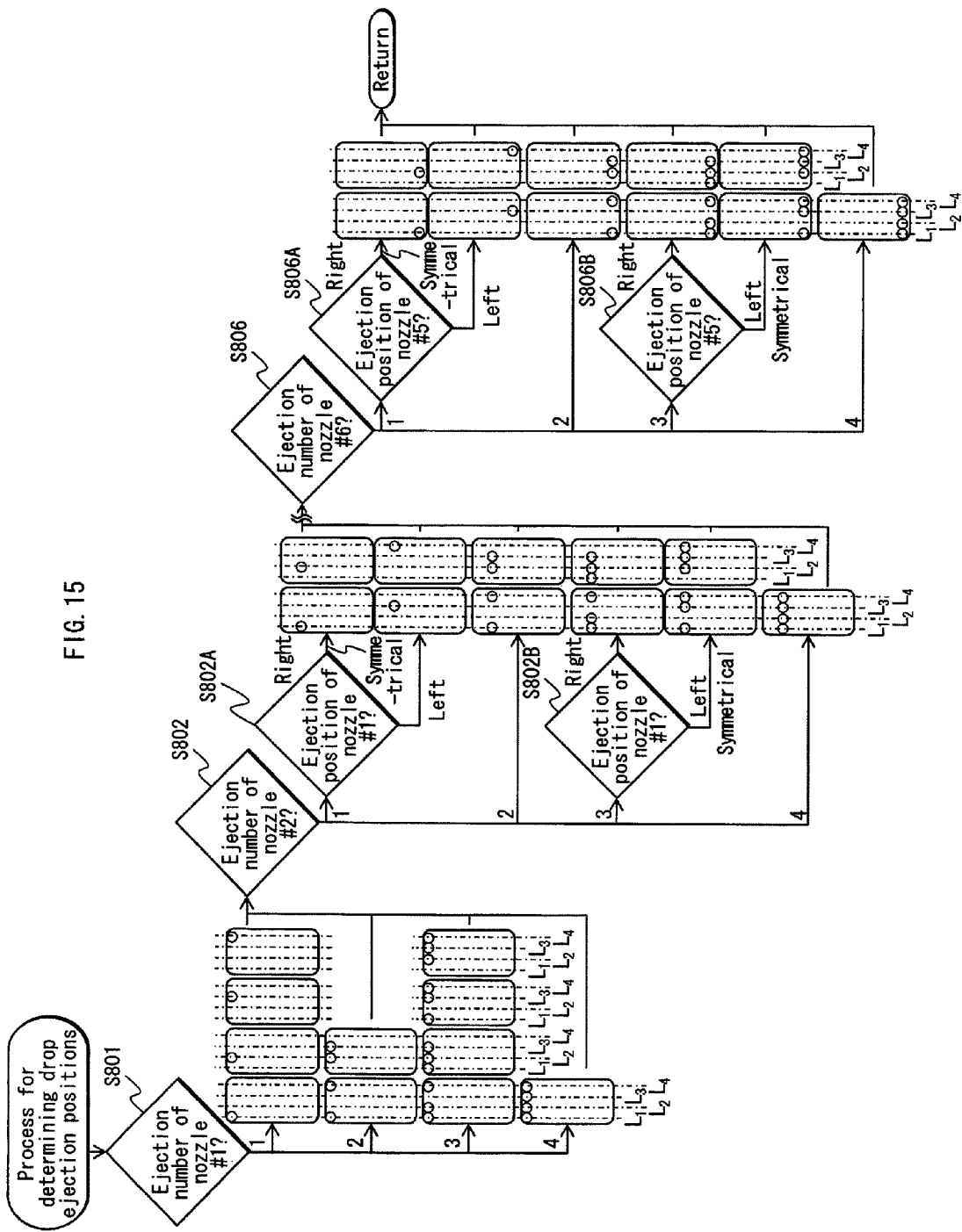
FIG. 15 shows the control flow for the ejection number control unit 300 when determining the drop ejection positions (maximum ejection number T=4).

FIGS. 14 and 15 show the control flow for the ejection number control unit 300 when determining the drop ejection positions.

The ejection number control unit 300 stores a control program for adjusting the impact locations of drops ejected by the nozzles into each aperture so that the impact locations are symmetrical with respect to an axis perpendicular to the scanning direction. The ejection number control unit 300 controls the drop ejection position for each ejection in accordance with this control program. For example, the ejection number control unit 300 stores a control program that performs the following sort of control flow.

FIG. 14 shows the control flow for the ejection number control unit 300 when the maximum ejection number T is three.

First, the number of ejections by nozzle #1 is determined (step S701). In this context, "nozzle #1" refers to nozzle #1 in the nozzle group corresponding to the aperture 17 in the selected row. Specifically, in step S103 of FIG. 8, when the aperture 17 in the top row among the apertures 17 shown in FIG. 7 is selected, "nozzle #1" corresponds to nozzle #1 in nozzle group a1.

When the number of ejections by nozzle #1 is one (step S701: 1), the drop is ejected onto line $L_2$. When the number of ejections by nozzle #1 is two (step S701: 2), the drops are ejected onto lines $L_1$ and $L_3$. When the number of ejections by nozzle #1 is three (step S701: 3), the drops are ejected onto lines $L_1$, $L_2$, and $L_3$. After performing the same control flow on nozzle #2 (step S702) through nozzle #6 (step S706) in the nozzle group, the process for determining the drop ejection positions is complete.

As shown in FIG. 14, when the maximum ejection number T is three, the impact locations for each nozzle can be controlled to be symmetrical with respect to an axis perpendicular to the scanning direction for any number of ejections between one and three. However, depending on the value of the maximum ejection number T, it may not be possible to control each nozzle in this way. In such a case, the impact location within each aperture is adjusted to be as symmetrical as possible with respect to an axis perpendicular to the scanning direction. The control flow for such adjustment is described with reference to FIG. 15.

FIG. 15 shows the control flow for the ejection number control unit 300 when the maximum ejection number T is four.

First, the number of ejections by nozzle #1 is determined (step S801). When the number of ejections is one (step S801: 1), one of four locations on which to eject the drop is selected: onto line $L_1$ (a), onto line $L_2$ (b), onto line $L_3$ (c), or onto line $L_4$ (d). When the number of ejections is two (step S801: 2), one of two sets of locations on which to eject the drops is selected: onto lines $L_1$ and $L_4$ (a), or onto lines $L_2$ and $L_3$ (b). When the number of ejections is three (step S801: 3), one of four sets of locations on which to eject the drops is selected: onto lines $L_1$, $L_2$, and $L_4$ (a), onto lines $L_1$, $L_2$, and $L_3$ (b), onto lines $L_1$, $L_3$, and $L_4$ (c), or onto lines $L_2$, $L_3$, and $L_4$ (d). When the number of ejections is four (S801: 4), drops are ejected onto lines $L_1$, $L_2$, $L_3$, and $L_4$.

Next, the number of ejections by nozzle #2 is determined (step S802). When the number of ejections by nozzle #2 is one (step S802: 1), the position of the drop(s) ejected by nozzle #1 is determined (step S802A). If the position of the drop(s) is determined to be biased towards the right, or if the drops are symmetrical (step S802A: "right" or "symmetrical"), one of two locations on which to eject the drop is selected: onto line $L_1$ (a), or onto line $L_2$ (b). If the position of the drop(s) is determined to be biased towards the left (step S802A: "left"), one of two locations on which to eject the drop is selected: onto line $L_3$ (a), or onto line $L_4$ (b). When the number of ejections is two (step S802: 2), one of two sets of locations on which to eject the drops is selected: onto lines $L_1$ and $L_4$ (a), or onto lines $L_2$ and $L_3$ (b). When the number of ejections is three (step S802: 3), the position of the drop(s) ejected by nozzle #1 is determined (step S802B). If the position of the drop(s) is determined to be biased towards the right (step S802B: "right"), one of two sets of locations on which to eject the drops is selected: onto lines $L_1$, $L_2$, and $L_4$ (a), or onto lines $L_1$, $L_2$, and $L_3$ (b). If the position of the drop(s) is determined to be biased towards the left, or if the drops are symmetrical (step S802B: "left" or "symmetrical"), one of two sets of locations on which to eject the drops is selected: onto lines $L_1$, $L_3$, and $L_4$ (a), or onto lines $L_2$, $L_3$, and $L_4$ (b). When the number of ejections is four (S802: 4), drops are ejected onto lines $L_1$, $L_2$, $L_3$, and $L_4$.

After performing the same control flow on nozzle #3 through nozzle #6 (steps S806, S086A, S806B) as on nozzle #2, the process for determining the drop ejection positions is complete.

Upon completion of the process for determining the drop ejection positions, the control flow for the selected row is complete (steps S103-S106 in FIG. 8). When the control flow has been performed for all rows (step S107 in FIG. 8: YES), drops are ejected into all rows of the apertures 17 (step S108), thus completing the application process.

Example

FIGS. 16A-16H show the positional relationship between the substrate subject to application 600 and the head section 301 during step S108 in FIG. 8. FIG. 16A-16H respectively show when step S108 has been reached after step S203 (FIG. 9), step S207 (FIG. 9, after performing step S208), step S303 (FIG. 10), step S304 (FIG. 10), step S405 (FIG. 11), step S406 (FIG. 11), step S409 (FIG. 11), and step S410 (FIG. 11). In FIGS. 16A-16H, the sizes of the circles indicating the nozzles 3030 in the head section 301 are based on the result of ranking in step S102 of FIG. 8.

To the upper-right of each of the nozzles #1-#6 in FIGS. 16A-16H, the rank to which the nozzle belongs is indicated. B rank nozzles simply indicated by a "B" are nozzles that are not a $B_A^+$ nozzle, a $B_A^-$ nozzle, a $B^+$ nozzle, or a $B^-$ nozzle, i.e. nozzles that correspond to the "B rank other than $B_A^+$, $B_A^-$" and the "B rank other than $B^+$, $B^-$" in steps S406, S409, and S410.

Figure 16:
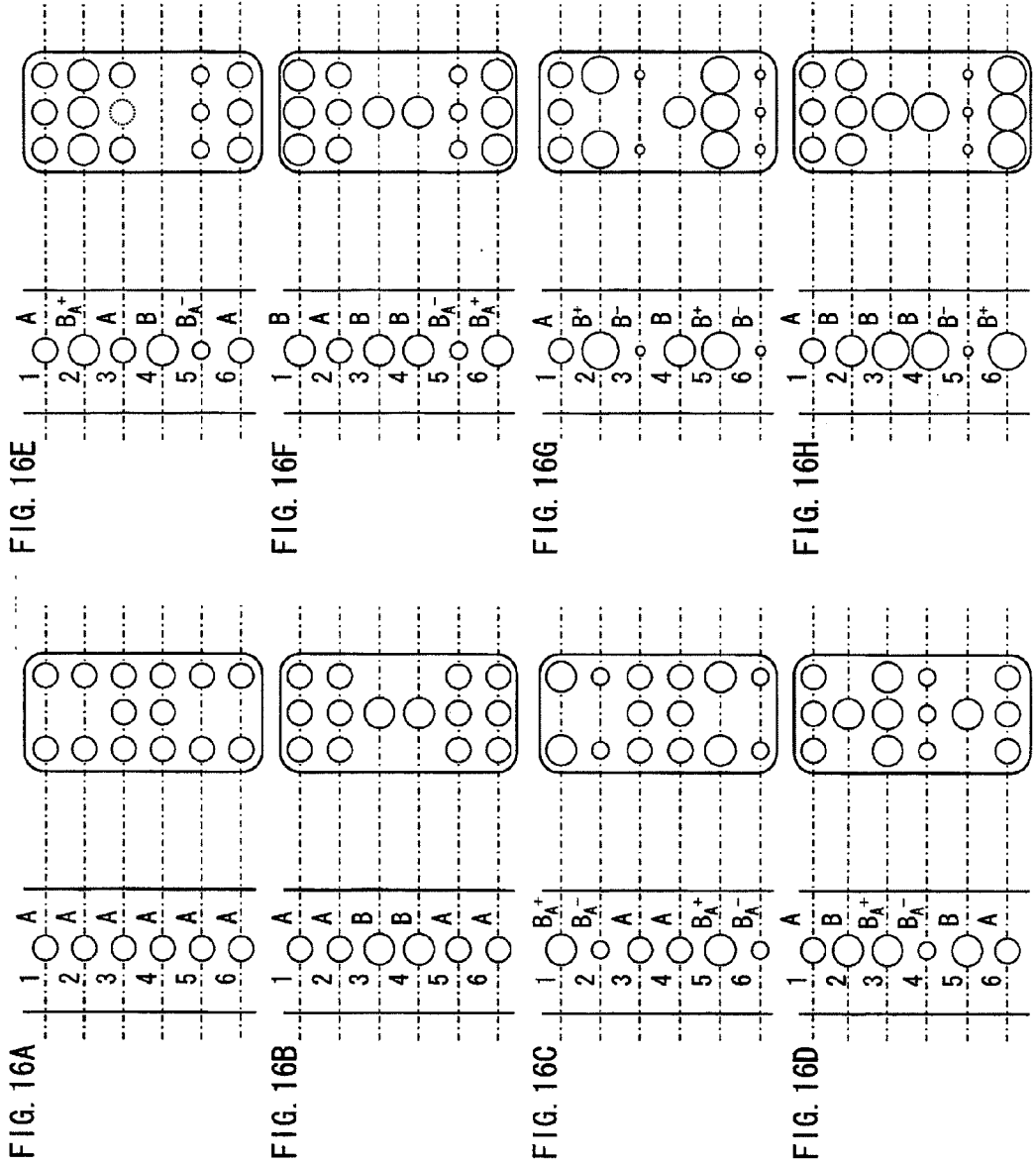
FIGS. 16A-16H show the positional relationship between the substrate subject to application and the head section during step S108 in FIG. 8.

Furthermore, in the example shown in FIG. 16, the target value for the total volume of the drops ejected into each aperture 17 is 140 pL, the set value $V_{set}$ is 10 pL, the necessary ejection number N is 14, and the maximum ejection number T is three.

In FIG. 16A, the volume of drops detected for each nozzle in step S101 (FIG. 8) is uniform, whereas in FIGS. 16B-16H, the volume varies within an aperture. In other words, in FIGS. 16B-16H, the predetermined number of nozzles corresponding to an aperture include nozzles with ejection volumes that differ to some degree, whereas such nozzles are not included in FIG. 16A.

FIG. 16A shows a case when the total volume of the drops ejected into each aperture 17 that can be ejected with only A rank nozzles is equal to or greater than the target value. FIG. 16B shows a case when a volume equal to or greater than the target value can be ejected if B rank nozzles are also used. In this figure, no $B^+$, $B^-$ nozzle pairs exist.

FIGS. 16C and 16D show cases in which the number of ejections by B rank nozzles is an even number. FIG. 16C shows a case when a volume equal to or greater than the target value can be ejected if B rank nozzles are also used. Furthermore, drops that are greater than or equal to the volume to be ejected by B rank nozzles can be ejected using only $B^+$, $B^-$ nozzle pairs. FIG. 16D shows a case when a volume equal to or greater than the target value can be ejected if B rank nozzles are also used. Drops that are greater than or equal to the volume to be ejected by B rank nozzles cannot, however, be ejected using only $B^+$, $B^-$ nozzle pairs.

FIGS. 16E-16H show cases in which the number of ejections by B rank nozzles is an odd number. FIG. 16E shows a case when a volume equal to or greater than the target value can be ejected if B rank nozzles are also used. Furthermore, drops that are greater than or equal to the volume to be ejected by B rank nozzles can be ejected using only $B_A^+$, $B_A^-$ nozzle pairs. Note that in step S405 of FIG. 11, the number of ejections by A rank nozzles is decreased by one. This reduction in drop ejections is indicated in FIG. 16E by a circle drawn with a dotted line.

FIG. 16F shows a case when a volume equal to or greater than the target value can be ejected if B rank nozzles are also used. Drops that are greater than or equal to the volume to be ejected by B rank nozzles cannot, however, be ejected using only $B_A^+$, $B_A^-$ nozzle pairs. FIG. 16G shows a case when a volume equal to or greater than the target value can be ejected if B rank nozzles are also used. Furthermore, drops that are greater than or equal to the volume to be ejected by B rank nozzles can be ejected using only $B^+$, $B^-$ nozzle pairs. FIG. 16H shows a case when a volume equal to or greater than the target value can be ejected if B rank nozzles are also used. Drops that are greater than or equal to the volume to be ejected by B rank nozzles cannot, however, be ejected using only $B^+$, $B^-$ nozzle pairs.

Positional Relationship Between the Head Section and the Apertures in the Substrate Subject to Application (Longitudinal Application)

Figure 17:
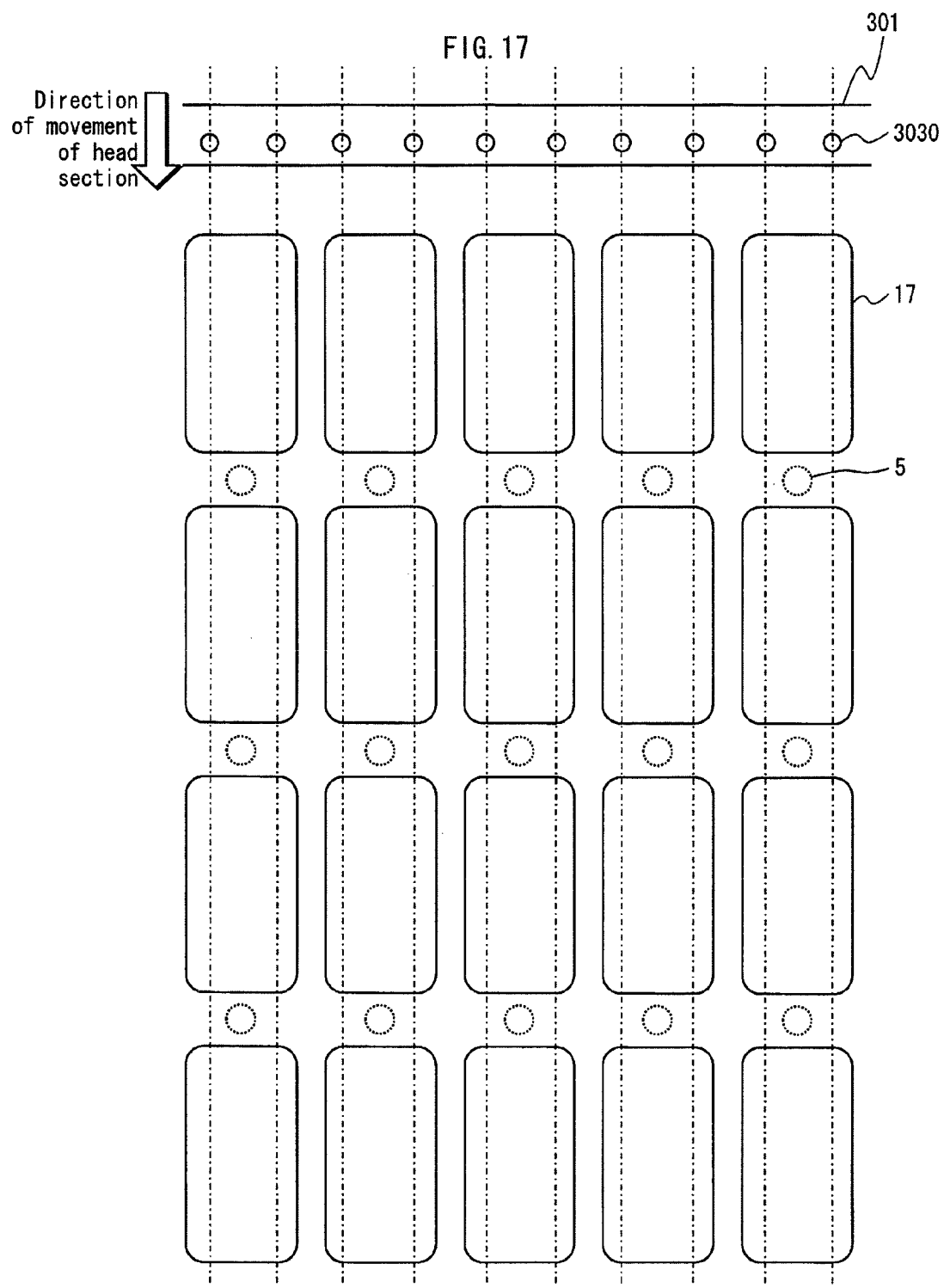
FIG. 17 shows the positional relationship between the substrate subject to application and the head section (during longitudinal application) in Embodiment 1.

As shown in FIG. 17, the control flow for the application process can also be applied when the longer side of the elongated apertures 17 matches the scanning direction (row (X) direction) of the head section 301, i.e. in the case of longitudinal application. In the example in FIG. 17, there are two nozzles 3030 for each aperture 17.

In either lateral or longitudinal application, any number of nozzles may correspond to each aperture 17. The number of nozzles may also be one. In the case of one nozzle per aperture 17, however, a problem occurs in that if a nozzle should happen to be an F rank nozzle, no drops will be ejected into the apertures 17 for which the F rank nozzle is responsible.

Accordingly, it is preferable that the number of nozzles 3030 corresponding to each aperture 17 be at least two. It is even more preferable to use as large a number as possible. A large number of nozzles for each aperture 17 greatly increases the effect during the application process of causing the total volume of drops to approach the target value. With respect to this point, an embodiment adopting lateral application is more preferable, since a larger number of nozzles can correspond to each aperture 17 with lateral application.

Summary

As described above, with the present embodiment, the total volume of the drops ejected into each aperture is made uniform with simple control that changes the number of ejections of drops per nozzle. Accordingly, with the present embodiment, it is unnecessary to perform complicated control that generates a different waveform for the driving voltage for each nozzle, as in Patent Literature 1. The present embodiment is also compatible with an increase in the number of nozzles in an inkjet head due to an increase in the size of organic EL display panels. Furthermore, since control in the present embodiment is simple, the size of the circuit substrate for performing control as in Patent Literature 1 can be reduced. Such a reduction in size both simplifies the manufacturing apparatus and reduces costs.

Embodiment 2

Figure 18:
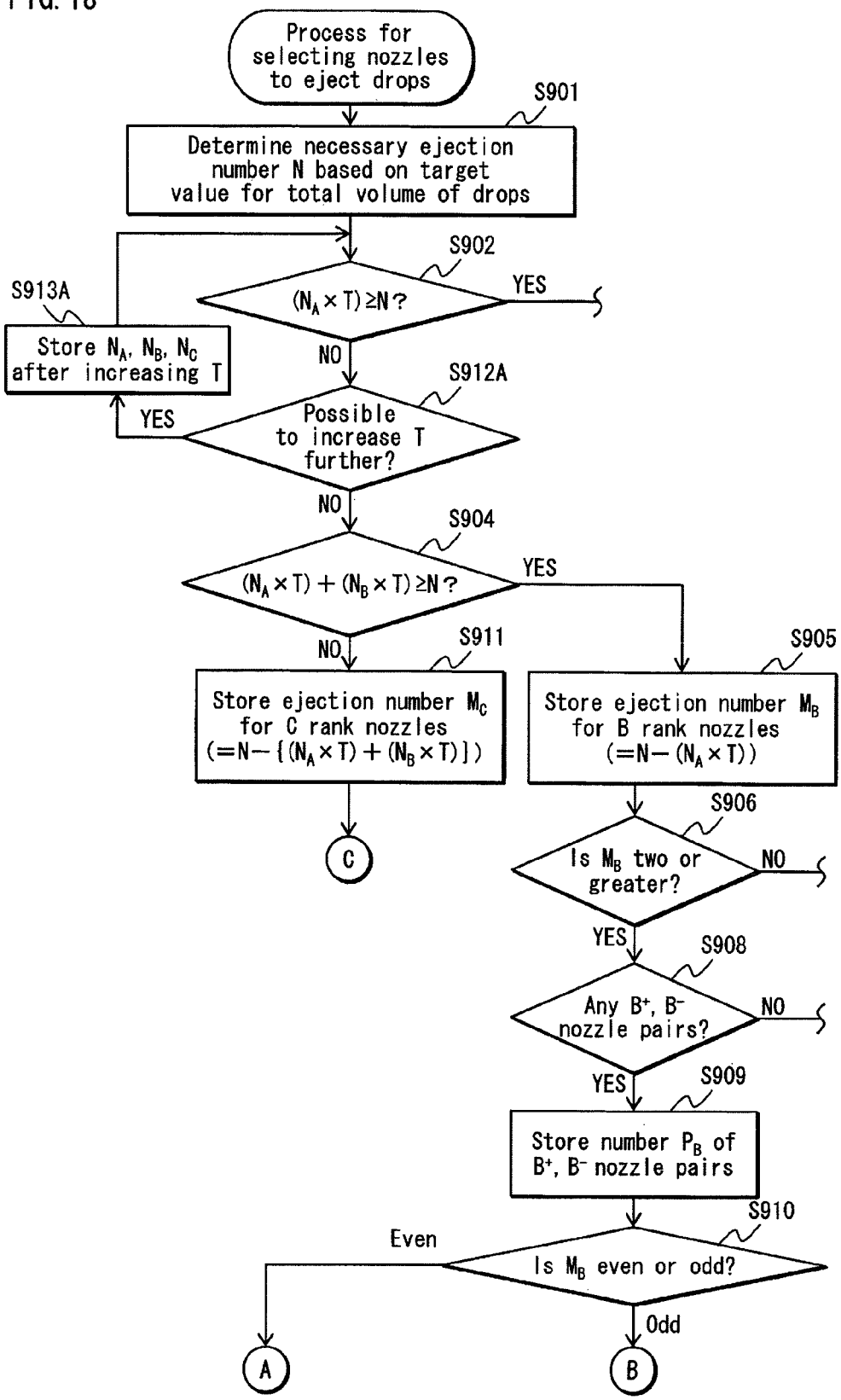
FIG. 18 shows the control flow of an ejection number control unit during the process of selecting nozzles for drop ejection in Embodiment 2.

FIG. 18 shows the control flow of an ejection number control unit during the process of selecting nozzles for drop ejection in Embodiment 2.

Steps S901, S902, S904-S906, and S908-S911 in FIG. 18 respectively correspond to steps S201, S202, S204-S206, and S208-S211 in FIG. 9. The differences with FIG. 9 are the inclusion of steps S912A and S913A.

In the present embodiment, when it is determined that $N_A \times T$ is less than the necessary ejection number N (i.e. drops with a volume equal to or greater than the target value cannot be ejected with only A rank nozzles; step S902: NO), it is determined whether the maximum ejection number T can be increased further (step S912A). The maximum ejection number T can be increased by changing the waveform of the driving voltage applied to the piezo element in order to increase the ejection frequency, or by decreasing the scanning speed of the inkjet head.

When it is determined that the maximum ejection number T can be further increased (step S912A: YES), the number of A rank nozzles $N_A$, the number of B rank nozzles $N_B$, and the number of C rank nozzles $N_C$ after the maximum ejection number T has been increased are stored (step S913A). Processing then proceeds to step S902. When it is determined that the maximum ejection number T cannot be increased (step S912A: NO), processing proceeds to step S904.

The ejection volume does not easily change over time for nozzles that eject drops with a volume nearly equal to the set value $V_{set}$. Accordingly, by using only such nozzles to eject drops, the step for detecting the drop volume for each nozzle (step S101 in FIG. 8), as well as the step for assigning ranks to nozzles (step S102 in FIG. 8) can be performed less frequently. This shortens the time necessary for the application process. To achieve this effect, the present embodiment increases the maximum ejection number T so that, insofar as possible, drops equal to or greater than the target value can be ejected with only A rank nozzles.

Figure 19:
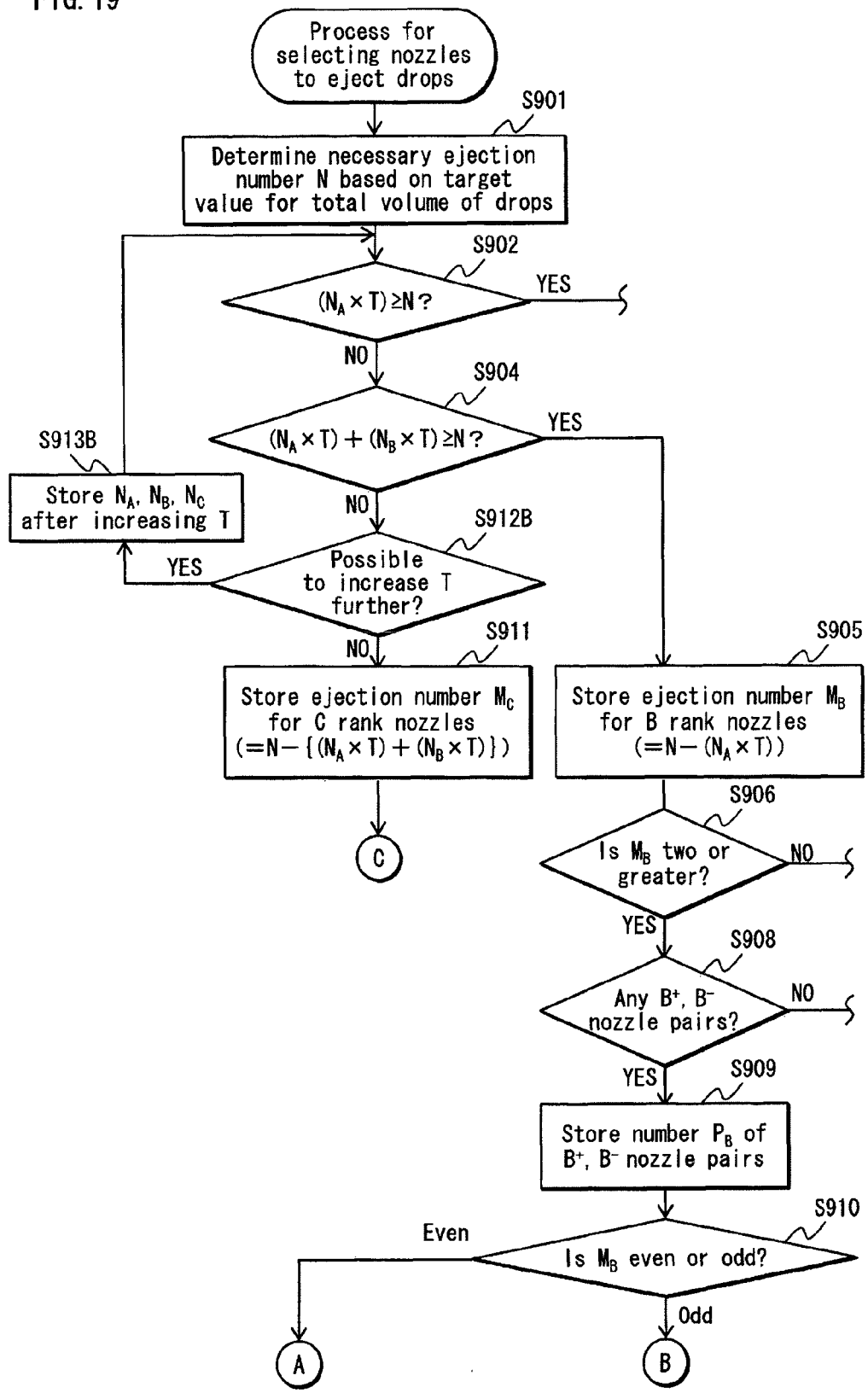
FIG. 19 shows the control flow of an ejection number control unit during the process of selecting nozzles for drop ejection in a modification to Embodiment 2.

FIG. 19 shows the control flow of an ejection number control unit during the process of selecting nozzles for drop ejection in a modification to Embodiment 2. The difference with FIG. 18 is the position of steps S912B and S913B, which respectively correspond to steps S912A and S913A in FIG. 18.

In FIG. 18, when it is determined that drops equal to or greater than the target value cannot be ejected with only A rank nozzles, it is determined whether or not the maximum ejection number T can be increased. In the present modification, however, when it is determined that drops equal to or greater than the target value cannot be ejected even if B rank nozzles are used (step S904: NO), it is determined whether or not the maximum ejection number T can be increased (step S912B).

When it is determined that the maximum ejection number T can be further increased (step S912B: YES), $N_A$, $N_B$, and $N_C$ after the maximum ejection number T has been increased are stored (step S913B), and processing proceeds to step S902. When it is determined that the maximum ejection number T cannot be increased (step S912B: NO), processing proceeds to step S911.

Embodiments 1 and 2 have been described thus far, but the present invention is in no way limited to Embodiments 1 and 2. The following modifications, for example, are possible.

Modifications (1) Stating that the apertures are "elongated" means that the apertures have long sides and short sides. The apertures need not be rectangular. The apertures may also be other shapes, such as a square, circle, or ellipse.

(2) In FIG. 1, the layers from the TFT layer 2 through the opposing electrode 14 are laminated on the substrate 1. However, the present invention may adopt a structure with any of the above layers removed, or including other layers such as a transparent conductive layer.

(3) In FIG. 3E, drops 19 of ink for the hole transport layer are not ejected into the concavities 8. In the present invention, drops 19 of ink for the hole transport layer may also be ejected into the concavities 8 to form an organic layer from the same material as the hole transport layer. Doing so promotes uniform vapor concentration of the solvent that evaporates from the hole transport layer, so that the hole transport layers 10 form to a uniform thickness. Conversely, in FIG. 4B, it is not necessary to eject drops 18 of ink for the organic light-emitting layers into the concavities 8.

(4) In the present invention, the concavities whose shape conforms to the contact holes are not required. Portions corresponding to the concavities in the layer of banks may, for example, be filled with the same material as the material for the layer of banks.

(5) In the above embodiments, an eutectic-point laser microscope is used as the drop volume detection camera 501. Alternatively, a CCD camera may be used. In this case, the shape of ink drops may, for example, be considered a semispherical. The CPU 150 may then calculate the volume of a drop of ink from the radius of the drop in the image photographed by the camera.

(6) In the above embodiments, the linear motors 204A, 205A, 204B, and 205B are only examples of means by which the gantries 210A and 210B move. Similarly, the servomotors 221A and 221B are only examples of means by which the moveable bodies 220A and 220B move. Use is not limited to these motors. For example, either the gantries or the moveable bodies, or both, may be moved using a timing belt mechanism or a ball screw mechanism.

(7) During the process to determine the drop ejection positions shown in FIGS. 14 and 15, a control flow has been described for adjusting the impact locations in each aperture so that the impact locations are symmetrical with respect to an axis perpendicular to the scanning direction. In order to make the impact locations within an aperture even more uniform, it is preferable for the impact locations to be uniform with respect to an axis parallel to the scanning direction as well.

(8) In FIG. 15, steps S802A and S806A fork in two directions, "right or symmetrical" and "left". These steps may fork in three directions, however: "right", "symmetrical", and "left". In this case, when drops are determined to be "symmetrical", one of four locations on which to eject the drop may be selected: onto line $L_1$ (a), onto line $L_2$ (b), onto line $L_3$ (c), or onto line $L_4$ (d). Similar control may be adopted in steps S802B and S806B as well.

(9) The above inkjet apparatus is only an example. Any inkjet apparatus that can perform at least the above-described control is acceptable. The position of the nozzles with respect to the substrate subject to application may be changed as needed, in accordance with the standard for the substrate or with substrate size, by adjusting the angle of the head section with respect to the fixed stage.

(10) In the present invention, the number of ejections by nozzles #1-#6 in each nozzle group is not fixed for all of the nozzle groups. Rather, the number may vary between nozzle groups depending on the results of detection by the drop volume detection unit. This point is explained with reference to FIG. 20.

FIGS. 20A1-D1' show the positional relationship between the substrate subject to application and the head section during step S108 in FIG. 8. In FIGS. 20A1-D1, the result of detection of drop volume by the drop volume detection unit is shown to the upper-right of each of the nozzles #1-#6. In these figures, the nozzle detection results of $B_2^+$, $B_1^+$, A, $B_1^-$, and $B_2^-$ respectively indicate 10.5 pL, 10.3 pL, 10 pL, 9.7 pL, and 9.5 pL. FIGS. 20A1-20D1 correspond to the present invention, whereas FIGS. 20A1'-D1' are comparative examples corresponding to FIGS. 20A1-D1.

In the present invention, as shown in FIGS. 20A1-D1, the number of ejections by nozzles #1-#6 in a nozzle group varies by nozzle group in accordance with the results of detection of drop volume by the drop volume detection unit. On the other hand, in the comparative examples shown in FIGS. 20A1'-D1', for all of the apertures in a column, nozzles #1, #2, #5, and #6 are each set to eject two drops, and nozzles #3 and #4 are each set to eject three drops. In other words, in the comparative examples shown in FIGS. 20A1'-D1', the number of ejections by nozzles #1-#6 is fixed for all of the nozzle groups.

Assuming the above sort of situation, the total volume in pL of the drops ejected into each aperture is indicated below each of the FIGS. 20A1-D1 and 20A1'-D1'.

In FIGS. 20A1-D1 according to the present invention, the total volume of drops in pL is 140 pL-141.9 pL (which is between 0 and +1.36% with respect to the target value of 140 pL). On the other hand, in FIGS. 20A1'-D1' according to the comparative examples, the total volume is 140 pL-143.6 pL (which is between 0 and +2.57% with respect to the target value of 140 pL). It is thus clear that error with respect to the target value is smaller when the number of ejections by nozzles #1-#6 in each nozzle group is not fixed for all of the nozzle groups. This difference is even more salient when a non-ejecting nozzle develops.

FIGS. 21A2-D2' show the positional relationship between the substrate subject to application and the head section during step S108 in FIG. 8 when a non-ejecting nozzle develops. FIGS. 21A2-21D2 and 21A2'-21D2' correspond to FIGS. 20A1-20D1 and 20A1'-20D1'. Note that among the nozzles 3030 shown in FIG. 21, non-ejecting nozzles are shown as filled-in circles.

In FIGS. 21A2-D2, even though a non-ejecting nozzle develops, the total volume in pL of the drops does not change, remaining at 140 pL-141.9 pL (which is between 0 and +1.36% with respect to the target value of 140 pL). This is because the number of ejections by each nozzle #1-#6 in each nozzle group can be changed. Accordingly, the present invention reduces the effect of a non-ejecting nozzle to a minimum.

On the other hand, in the case of FIGS. 21A2'-D2' according to the comparative examples, the number of ejections by each nozzle #1-#6 in each nozzle group cannot be changed. As a result, the total volume in pL of the drops is 112.1 pL-120 pL (which is between −19.93% and −14.29% with respect to the target value of 140 pL). These values differ greatly from the target value of 140 pL.

As described above, the present invention can be considered even more effective when a non-ejecting nozzle develops.

(11) The above embodiments describe a method for causing a head section to scan over a substrate subject to application, but the present invention is not limited in this way. The substrate subject to application may be moved with respect to a head section having a plurality of nozzles disposed therein.

(12) As described above, during the process of applying the ink for the organic light-emitting layer, the total volume of drops ejected into each aperture 17 may differ by luminescent color, but this is not necessarily the case. Furthermore, ink whose total volume need not be changed for different luminescent colors, such as ink applied to form the hole transport layer, may be applied either in the same volume for every color or in different volumes for different colors.

(13) FIG. 16H shows an example in which processing proceeds to step S108 after step S410 in FIG. 11. Other than the example shown in FIG. 16H, another example of performing step S108 after step S410 is when nozzle #1 is an A rank nozzle, nozzles #2-#4 are $B_A^+$ rank nozzles, nozzle #5 is a $B^-$ rank nozzle, and nozzle #6 is a $B^+$ rank nozzle. In this case, in accordance with the flowcharts in FIGS. 9-11, the A rank nozzle #1 ejects a drop three times, the $B_A^+$ rank nozzles eject a drop five times (five being the sum total of the number of ejections by nozzles #2-#4), and the $B^-$ rank nozzle #5 and $B^+$ rank nozzle #6 each eject a drop three times. As a result, the total volume of drops ejected into the apertures is 141.5 pL.

In this case, the total volume of drops ejected into the apertures can be brought closer to the target value by adding the following control to the above flowcharts. Specifically, when the total volume of drops is larger than the target value, as in the present example, a portion of the ejections by a $B^+$ rank nozzle (nozzle #6) is controlled to be ejected instead by $B_A^+$ rank nozzles (nozzles #2-#4), whose ejection amount is closer to the set value $V_{set}$. In the present example, this control sets the nozzle #1 (A rank) to eject a drop three times, the $B_A^+$ rank nozzles to eject a drop seven times (seven being the sum total of the number of ejections by nozzles #2-#4), the nozzle #5 ($B^-$ rank) to eject a drop three times, and the nozzle #6 ($B^+$ rank) to eject a drop once. As a result, the total volume of drops ejected into the apertures is 141.1 pL. This value is closer to the target value. Similar control may be adopted when the total volume of drops is less than the target value.

INDUSTRIAL APPLICABILITY

The method of manufacturing of an organic EL display panel according to the present invention can be effectively applied when manufacturing an organic EL display panel for use as any type of display device, television, display in a portable electronic device, or the like for home, public, or business use.

REFERENCE SIGNS LIST 1 substrate
2 TFT layer
3 power supply electrode
4 planarizing film
5 contact hole
6 pixel electrode
7 layer of banks
8 concavity
9 hole injection layer
10 hole transport layer
11 organic light-emitting layer
12 electron transport layer
13 electron injection layer
14 opposing electrode
16 organic layer including material for organic light-emitting layer
17 aperture
18 drop including ink for organic light-emitting layer
19 drop of ink for hole transport layer
20 inkjet table
30 inkjet head
50 drop volume detection unit
100 organic EL display panel
150 CPU
151 storage unit
152 input unit
200 base
201A, 201B, 202A, 202B stand
203A, 203B guide shaft
204A, 205A, 204B, 205B linear motor
210A, 210B gantry
211A, 211B, 212A, 212B guide groove
213, 500 control unit
220A, 220B moveable body
221A, 221B servomotor
300 ejection number control unit
301 head
302 main body
304 servomotor
501 drop volume detection camera
600 substrate subject to application
1000 inkjet apparatus
3010 piezo element
3030 nozzle
IP ink pan
ST fixed stage

What is claimed is:

1. A method of manufacturing an organic EL display panel, comprising:
   a first step of preparing an EL substrate provided with a layer of banks defining a plurality of apertures arranged in a matrix in one-to-one correspondence with subpixels;
   a second step of detecting a volume per drop of drops ejected by each nozzle of an inkjet head having arranged thereon a row of a plurality of nozzles that eject drops of ink including organic material and solvent;
   a third step of allocating a predetermined number of nozzles to each aperture by dividing the plurality of nozzles into nozzle groups and assigning one of the nozzle groups to each aperture, and of determining an ejection number of drops to be ejected by each nozzle in each nozzle group in accordance with variation in the detected volume per drop for each nozzle as detected in the second step, so that a total volume of the drops to be ejected into each aperture falls within a reference range; and
   a fourth step of causing the inkjet head to scan over the EL substrate while causing nozzles in the nozzle groups to eject, into the aperture corresponding to each nozzle group, a number of drops equal to the ejection number determined for each nozzle in the third step, wherein
   each subpixel corresponds to a predetermined luminescent color, and a target value of the total volume of the drops to be ejected into each aperture is set for each luminescent color, and
   the third step includes
      determining whether a volume of drops equal to or greater than the target value can be ejected by causing one or more first nozzles among the plurality of nozzles to eject drops, the detected volume per drop of the one or more first nozzles falling within a first range of a preset value,
      selecting the one or more first nozzles for ejection of drops in the fourth step upon determining that a volume of drops equal to or greater than the target value can be ejected by the one or more first nozzles, and
      selecting the one or more first nozzles and one or more second nozzles for ejection of drops in the fourth step upon determining that a volume of drops equal to or greater than the target value cannot be ejected by the one or more first nozzles, the detected volume per drop of the second nozzles falling within a second range of the preset value, the second range being greater than the first range.

2. The method of manufacturing an organic EL display panel of claim 1, wherein
   the third step further includes, upon determining that a volume of drops equal to or greater than the target value cannot be ejected by the one or more first nozzles,
      determining whether the second nozzles include one or more nozzle pairs each composed of a nozzle having a detected volume per drop greater than the preset value and a nozzle having a detected volume per drop less than the preset value, and
      selecting the one or more nozzle pairs for ejection of drops in the fourth step upon determining that the second nozzles include the one or more nozzle pairs.

3. The method of manufacturing an organic EL display panel of claim 1, wherein
   the third step further includes, upon determining that a volume of drops equal to or greater than the target value cannot be ejected by the one or more first nozzles,
      determining whether the second nozzles include one or more nozzle pairs each composed of a nozzle having a detected volume per drop greater than the preset value and a nozzle having a detected volume per drop less than the preset value, and
      upon determining that the second nozzles include the one or more nozzle pairs, determining whether the one or more nozzle pairs include one or more first range nozzle pairs, each first range nozzle pair having an average detected volume per drop that falls within the first range, and
      selecting the one or more first range nozzle pairs for ejection of drops in the fourth step upon determining that the one or more nozzle pairs include the one or more first range nozzle pairs.

4. The method of manufacturing an organic EL display panel of claim 1, wherein
the third step includes
adjusting an impact location within each aperture of each drop ejected by each nozzle in each nozzle group so that the impact locations of the drops in each aperture are dispersed.

5. The method of manufacturing an organic EL display panel of claim 1, wherein
the third step includes
adjusting an impact location within each aperture of each drop ejected by each nozzle in each nozzle group so that the impact locations of the drops in each aperture are symmetrical with respect to a line traversing a center of each aperture in a same column.

6. The method of manufacturing an organic EL display panel of claim 1, wherein
each aperture is elongated in a columnar direction.

* * * * *